US011101394B2

(12) United States Patent
Kim et al.

(10) Patent No.: US 11,101,394 B2
(45) Date of Patent: Aug. 24, 2021

(54) METHOD OF TRANSFERRING TIN SULFIDE FILM AND PHOTOELECTRIC DEVICE USING THE METHOD

(71) Applicant: INU Research & Business Foundation, Incheon (KR)

(72) Inventors: Joon Dong Kim, Incheon (KR); Malkeshkumar Patel, Incheon (KR)

(73) Assignee: INU RESEARCH & BUSINESS FOUNDATION, Incheon (KR)

(*) Notice: Subject to any disclaimer, the term of this patent is extended or adjusted under 35 U.S.C. 154(b) by 0 days.

(21) Appl. No.: 16/402,180

(22) Filed: May 2, 2019

(65) Prior Publication Data
US 2019/0341511 A1 Nov. 7, 2019

(30) Foreign Application Priority Data

May 2, 2018 (KR) .................. 10-2018-0050462

(51) Int. Cl.
*H01L 31/032* (2006.01)
*H01L 31/18* (2006.01)
*H01L 21/02* (2006.01)

(52) U.S. Cl.
CPC .... *H01L 31/0324* (2013.01); *H01L 21/02557* (2013.01); *H01L 31/18* (2013.01); *H01L 31/1892* (2013.01)

(58) Field of Classification Search
CPC .................. H01L 31/0324; H01L 31/1892
See application file for complete search history.

(56) References Cited

U.S. PATENT DOCUMENTS 4,292,395 A * 9/1981 Wada .................. G03F 1/54
430/167
9,840,024 B2 12/2017 Zaretski et al.

FOREIGN PATENT DOCUMENTS

| KR | 1020160004433 A | 1/2016 |
| KR | 1020160093375 A | 8/2016 |
| KR | 1020170045040 A | 4/2017 |
| KR | 20180028137 A * | 3/2018 |
| KR | 1020180028137 A | 3/2018 |

OTHER PUBLICATIONS

KR20180028137A, machine translation. (Year: 2018).*

* cited by examiner

*Primary Examiner* — Robert A Vetere
(74) *Attorney, Agent, or Firm* — Alston & Bird LLP

(57) ABSTRACT

Provided are a method of transferring a tin sulfide film and a photoelectric device using the tin sulfide film. The method includes: forming a first tin sulfide film on a first substrate; placing a second substrate on the first tin sulfide film; and forming a second tin sulfide film bonded to a surface of the second substrate by transferring a portion of the first tin sulfide film to the second substrate through a rapid thermal process (RTP).

14 Claims, 45 Drawing Sheets
(33 of 45 Drawing Sheet(s) Filed in Color)

Fig. 1
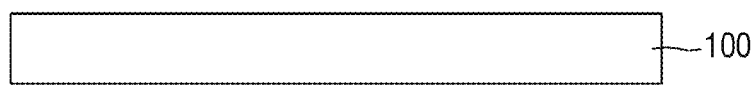
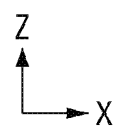
Fig. 2
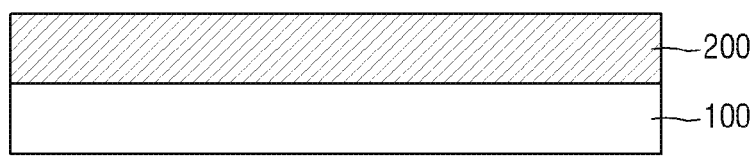
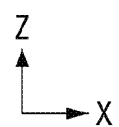

Fig. 3
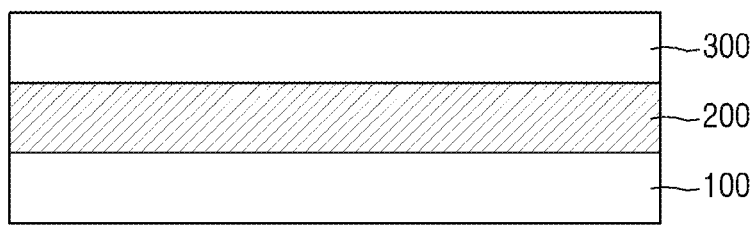
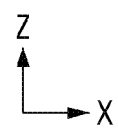
Fig. 4
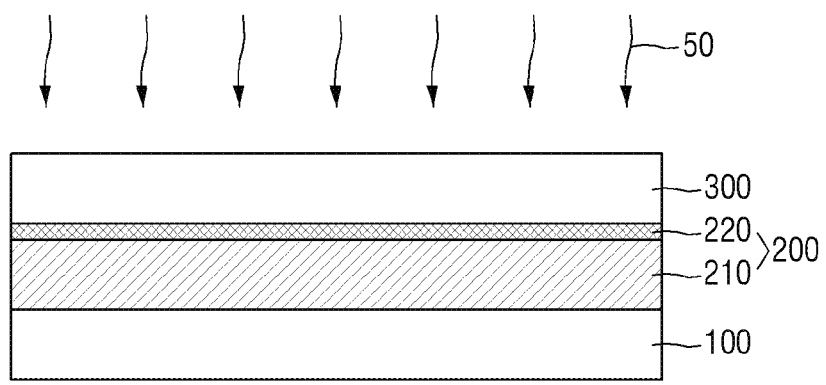
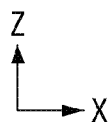

Fig. 5
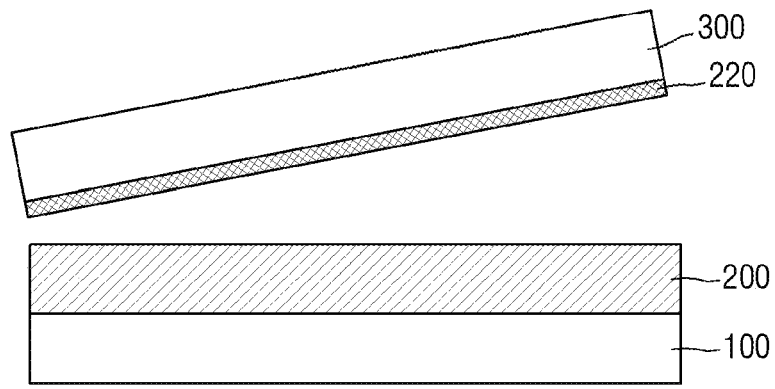
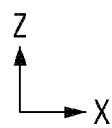
Fig. 6
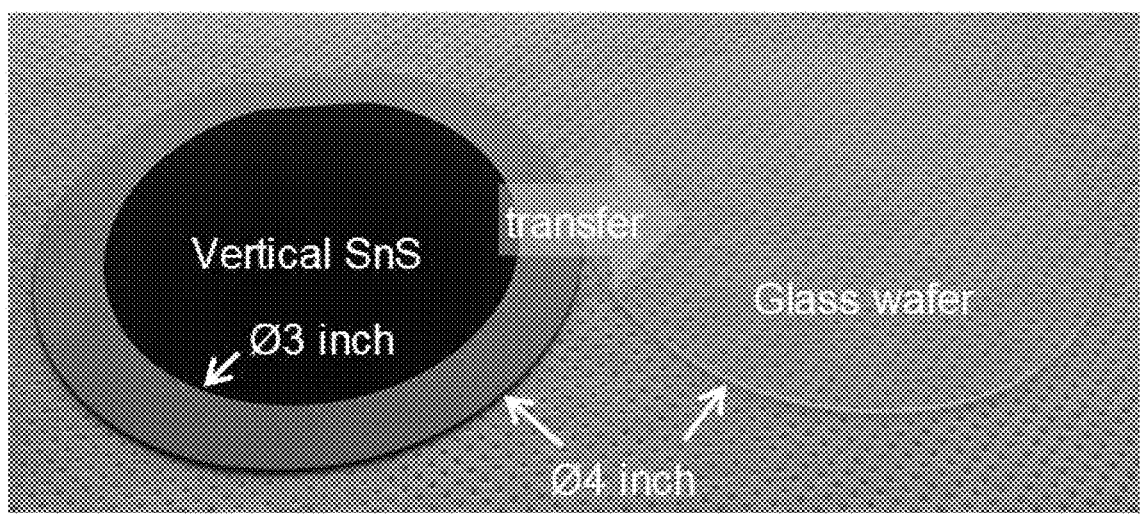

| Bias | UV (λ = 365 nm) | | Visible (λ = 530 nm) | | NIR (λ = 850 nm) | |
|---|---|---|---|---|---|---|
| | Rise time (ms) | Fall time (ms) | Rise time (ms) | Fall time (ms) | Rise time (ms) | Fall time (ms) |
| 2 V | 2.9 | 27.1 | 9.1 | 3.1 | 4.1 | 25.1 |
| 1 V | 7.6 | 50.8 | 3.7 | 6.2 | 4.3 | 18.7 |
| 0.5 V | 2.3 | 58.3 | 8.3 | 9.2 | 1.2 | 26.9 |
| 0.2 V | 9.1 | 30.9 | 9.2 | 7.3 | 4.4 | 19.6 |
| 0.05 V | 14.9 | 14.4 | 38.0 | 33.2 | 23 | 20.9 |

METHOD OF TRANSFERRING TIN SULFIDE FILM AND PHOTOELECTRIC DEVICE USING THE METHOD

This application claims the benefit of Korean Patent Application No. 10-2018-0050462, filed on May 2, 2018, in the Korean Intellectual Property Office, the disclosure of which is incorporated herein by reference in its entirety.

BACKGROUND

1. Field

The present disclosure relates to a method of transferring a tin sulfide film and a photoelectric device using the method.

2. Description of the Related Art

Two-dimensional (2D) materials are highly valuable for optical utilization due to their properties such as proper bandgap and high light absorbance. However, the growth of 2D materials is extremely difficult and very limited in size. In addition, a high-temperature process is often required, and a special process is required to fabricate a device using a very small sized 2D material. Due to these limitations, it is difficult to fabricate and apply a 2D material-based device having a large area.

SUMMARY

Aspects of the present disclosure provide a method of easily transferring a tin sulfide film.

Aspects of the present disclosure also provide a photoelectric device using a method of easily transferring a tin sulfide film.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a method of transferring a tin sulfide film. The method includes: forming a first tin sulfide film on a first substrate; placing a second substrate on the first tin sulfide film; and forming a second tin sulfide film bonded to a surface of the second substrate by transferring a portion of the first tin sulfide film to the second substrate through a rapid thermal process (RTP).

According to another aspect of the present disclosure, there is provided a photoelectric device including: a transparent substrate including a first surface and a second surface on each of which light is incident, wherein the first surface includes first and second areas; a transparent conductive film which is formed on the first area; and a tin sulfide film which is formed along an upper surface of the transparent conductive film and the second area.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and/or other aspects will become apparent and more readily appreciated from the following description of the embodiments, taken in conjunction with the accompanying drawings in which:

FIGS. 1 through 5 are views illustrating steps of a method of transferring a tin sulfide film according to embodiments:

FIG. 6 is an image showing a tin sulfide film before being transferred in the method of transferring a tin sulfide film according to the embodiments;

DETAILED DESCRIPTION

Figure 7:
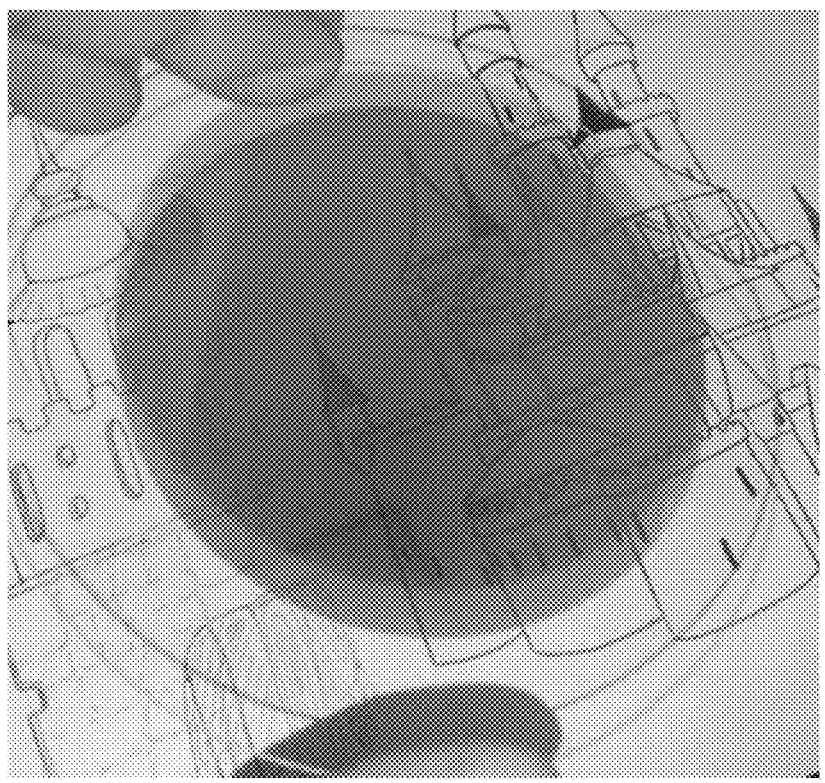
FIG. 7 is an image showing the transparency of a transferred tin sulfide film in the method of transferring a tin sulfide film according to the embodiments.

Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the invention to those skilled in the art, and the present disclosure will only be defined by the appended claims. Like reference numerals refer to like elements throughout the specification.

It will be understood that, although the terms first, second, third, etc., may be used herein to describe various elements, components, and/or sections, these elements, components, and/or sections should not be limited by these terms. These terms are only used to distinguish one element, component, or section from another element, component, or section. Thus, a first element, component, or section discussed below could be termed a second element, component, or section without departing from the teachings of the present disclosure.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present.

Spatially relative terms, such as "below," "beneath," "lower." "above," and "upper", may be used herein for ease of description to describe the relationship of one element or component to another element(s) or component(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" or "beneath" can encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A method of transferring a tin sulfide film according to embodiments will now be described with reference to FIGS. 1 through 6.

FIGS. 1 through 5 are views illustrating steps of a method of transferring a tin sulfide film according to embodiments.

First, referring to FIG. 1, a first substrate 100 is provided.

The first substrate 100 may be a semiconductor substrate. For example, the first substrate 100 may be a silicon substrate. The first substrate 100 may also be a metal substrate, a glass substrate, or a plastic substrate in the method of transferring a tin sulfide film according to the embodiments. The plastic substrate may have flexible characteristics.

The first substrate 100 may be any substrate on which a first tin sulfide film 200 can grow. The first substrate 100 may include upper and lower surfaces opposite to each other. The upper surface and the lower surface of the first substrate 100 may be flat.

Here, side surfaces of the first substrate 100 may be defined as surfaces in a first direction X. and the upper surface and the lower surface may be defined as surfaces in a second direction Z. The first direction X and the second direction Z may be perpendicular to each other. For example, the first direction X may be any one of horizontal directions, and the second direction Z may be a vertical direction.

Next, referring to FIG. 2, the first tin sulfide film 200 is formed on the first substrate 100.

Specifically, the first tin sulfide film 200 may be formed on the upper surface of the first substrate 100. The first tin sulfide film 200 may include SnS. The first tin sulfide film 200 may be sputtered using a tin sulfide target. Here, the tin sulfide target may include $SnS_2$ or SnS.

If a SnS2 target is used, it may be converted into SnS by in-situ phase structural transition of SnS2. That is, as sulfur is depleted, SnS2 may be converted into SnS, thereby forming the first tin sulfide film 200. A thermal process of the sputtering may be performed at a temperature of 100° C. to 700° C.

Alternatively the first tin sulfide film 200 may be formed by any one of chemical vapor deposition (CVD) and atomic layer deposition (ALD).

Here, the first tin sulfide film 200 may have a growth direction in the second direction Z, that is, the vertical direction. That is, the first tin sulfide film 200 has characteristics of a two-dimensional (2D) material. A 2D film may denote a material having a far higher growth rate in a direction of forming a flat plane, that is, a lateral direction of the plane than in other directions.

The first tin sulfide film 200 is a 2D material, and the growing lateral direction of a specific plane may be the second direction Z. That is, the plane of the first tin sulfide film 200 may be defined such that a surface is formed in a horizontal direction such as the first direction X and side surfaces are formed in the second direction Z.

Next, referring to FIG. 3, a second substrate 300 is placed on the first tin sulfide film 200.

The second substrate 300 may be a transparent substrate. The second substrate 300 may be, for example, a glass substrate, a semiconductor substrate, or a plastic substrate. The second substrate 300 can have another material as long as it is a substrate through which light can pass. The plastic substrate may have flexible characteristics.

Alternatively, the second substrate 300 may be a substrate that is not transparent. For example, an opaque metal substrate, a semiconductor substrate, and a plastic substrate can be targets of transfer. However, the second substrate 300 should be transparent in order to fabricate a transparent device. A lower surface of the second substrate 300 and an upper surface of the first tin sulfide film 200 may directly contact each other. However, the lower surface of the second substrate 300 and the upper surface of the first tin sulfide film 200 may not yet be bonded to each other.

Next, referring to FIG. 4, a rapid thermal process (RTP) 50 is performed.

A portion of the first tin sulfide film 200 may be changed into a second tin sulfide film 220 by the RTP 50. Specifically, the RTP 50 may cause the first tin sulfide film 200 to include the second tin sulfide tin film 220 and a third tin sulfide tin film 210.

The RTP 50 may be performed at a temperature of 100° C. to 1000° C. The RTP 50 may be performed for 1 second to 3 hours. Since the duration of the RTP 50 is a factor that determines the thickness of the second tin sulfide film 220, it may be adjusted appropriately. The thickness of the second tin sulfide film 220 varies according to the number of stacked films. Ultimately, the duration of the RTP 50 may be a factor that determines the number of films included in the second tin sulfide film 220.

The second tin sulfide tin film 220 may be a portion contacting the lower surface of the second substrate 300, and the third tin sulfide film 210 may be a portion disposed below the second tin sulfide film 220. The second tin sulfide film 220 may have a growth direction different from that of the first tin sulfide film 200. That is, while the first tin sulfide film 200 has a growth direction in the second direction Z, the second tin sulfide film 220 may be a 2D material having a growth direction in a horizontal direction including the first direction X.

That is, the second tin sulfide film 220 may be formed to form a plane parallel to the second substrate 300. In addition, the second tin sulfide film 220 may have a structure in which a plurality of films are stacked in the second direction Z. Each of the films may be in the form of a flat film that forms a plane parallel to the second substrate 300 as described above. The films may be combined by van der Waals interactions.

The third tin sulfide film 210 may have the same growth direction as the first tin sulfide film 200. That is, the third tin sulfide film 210 may have a vertical growth direction in the second direction Z. This is because the remaining portion of the first tin sulfide film 200 excluding a portion which is the second tin sulfide film 220 has the same properties as the first tin sulfide film 200.

The second tin sulfide film 220 is a portion originally bonded to the first substrate 100, but may be transferred to the second substrate 300 by the RTP 50. Accordingly, an upper surface of the second tin sulfide film 220 and the lower surface of the second substrate 300 may be bonded to each other.

Next, referring to FIG. 5, the second substrate 300 and the second tin sulfide film 220 may be separated to form the second tin sulfide film 220 transferred onto the second substrate 300.

Since the second tin sulfide film 220 has a weak adhesive force of van der Waals interactions with the third tin sulfide film 210, it can be easily separated. Although the second tin sulfide film 220 is transferred to the lower surface of the second substrate 300, if the second substrate 300 is turned upside down, a device having the second tin sulfide film 220 may be provided on an upper surface of the second substrate 300.

The present disclosure relates to a technology for transferring a required number of films of a 2D material while growing the 2D material in a large area.

A rapid transfer process is possible through an RTP, and the characteristics of a transferred 2D material are excellent. Further, a 2D material grown in bulk may be transferred to a target substrate by adjusting the number of layers of the 2D material.

In addition, the transfer method may be performed repeatedly not once.

Through this method, a 2D material grown in a large area can be repeatedly transferred to a target substrate to a required size and thickness (or number of single films). This technique can provide properties favorable to a flexible device having a low melting point, such as a plastic substrate.

In addition, the transfer method of the present disclosure does not use mechanical exfoliation and chemical exfoliation, unlike the conventional art. Therefore, an object to be transferred, that is, a tin sulfide film can be transferred to the second substrate 300 without contamination or damage and can be used to fabricate a photoelectric device with better performance.

The method of transferring a tin sulfide film according to the embodiments may be performed repeatedly. That is, after a tin sulfide film is transferred to the second substrate 300, a portion of the remaining portion of the first tin sulfide film 200, that is, a portion of the third tin sulfide film 210 may be transferred to a third substrate by performing an RTP on the third substrate. This process may be performed not just twice, but as many times as necessary.

Therefore, in the method of transferring a tin sulfide film according to the embodiments, a tin sulfide film can be stably transferred to different substrates. In addition, the transfer difficulty such as size limitation of a 2D tin sulfide film can be easily overcome.

In the method of transferring a tin sulfide film according to the embodiments, the second tin sulfide film 220 of the second substrate 300, not the remaining portion of the first tin sulfide film 200 of the first substrate 100, i.e., the third tin sulfide film 210, can be transferred to a fourth substrate. That is, when it is difficult to transfer a tin sulfide film from the first substrate 200 directly to the final fourth substrate, the tin sulfide film may be transferred to the fourth substrate via the second substrate 300.

Example 1-5 nm/5 Minutes

A vertical SnS film was formed on a silicon substrate on a wafer scale. Here, the SnS film was formed using in-situ phase structural transition of $SnS_2$ particles. That is, the $SnS_2$ particles were sputtered at 300° C. under an Ar flow rate of 50 sccm and a pressure of 6 mTorr with an RF power of 50 W. The SnS film growing vertically was formed by a sulfur depletion phenomenon.

FIG. 6 is an image showing a tin sulfide film before being transferred in the method of transferring a tin sulfide film according to the embodiments.

Referring to FIG. 6, a 4-inch silicon substrate and a 4-inch glass substrate may be prepared, and a vertical SnS film may be formed on a 3-inch wafer scale. Then, the SnS film may be transferred from the silicon substrate onto the glass substrate.

The glass substrate is placed on the SnS film, and the SnS film is transferred to the glass substrate by an RTP performed under conditions of a maximum temperature of 450° C. and a pressure of 8 mTorr. At this time, the rate of temperature rise is 1.416° C./s, and the thickness of the SnS film on the glass substrate is determined by the duration of the RTP. That is, as the duration of the RTP increases, the thickness of the SnS film on the glass substrate increases. In Example 1, since the duration of the RTP was 5 minutes, the thickness of the SnS film on the glass substrate was 5 nm.

FIG. 7 is an image showing the transparency of a transferred tin sulfide film in the method of transferring a tin sulfide film according to the embodiments.

Referring to FIG. 7, it can be seen that a SnS film formed on a glass substrate is translucent.

Example 2-9 nm/10 Minutes

The same procedure as in Example 1 was performed except that the SnS film on the glass substrate was made to have a thickness of 9 nm by performing the RTP for 10 minutes.

Example 3-10 nm

The same procedure as in Example 1 was performed except that the SnS film on the glass substrate was made to have a thickness of 10 nm.

Example 4-11 nm/13 Minutes

The same procedure as in Example 1 was performed except that the SnS film on the glass substrate was made to have a thickness of 11 nm by performing the RTP for 13 minutes.

Example 5-14 nm/15 Minutes

The same procedure as in Example 1 was performed except that the SnS film on the glass substrate was made to have a thickness of 14 nm by performing the RTP for 15 minutes.

Example 6-16 nm/16 Minutes

The same procedure as in Example 1 was performed except that the SnS film on the glass substrate was made to have a thickness of 16 nm by performing the RTP for 16 minutes.

Example 7-18 nm/20 Minutes

The same procedure as in Example 1 was performed except that the SnS film on the glass substrate was made to have a thickness of 18 nm by performing the RTP for 20 minutes.

Example 8-23 nm/25 Minutes

The same procedure as in Example 1 was performed except that the SnS film on the glass substrate was made to have a thickness of 23 urn by performing the RTP for 25 minutes.

Example 9-32 nm/35 Minutes

The same procedure as in Example 1 was performed except that the SnS film on the glass substrate was made to have a thickness of 32 nm by performing the RTP for 35 minutes.

Figure 8:
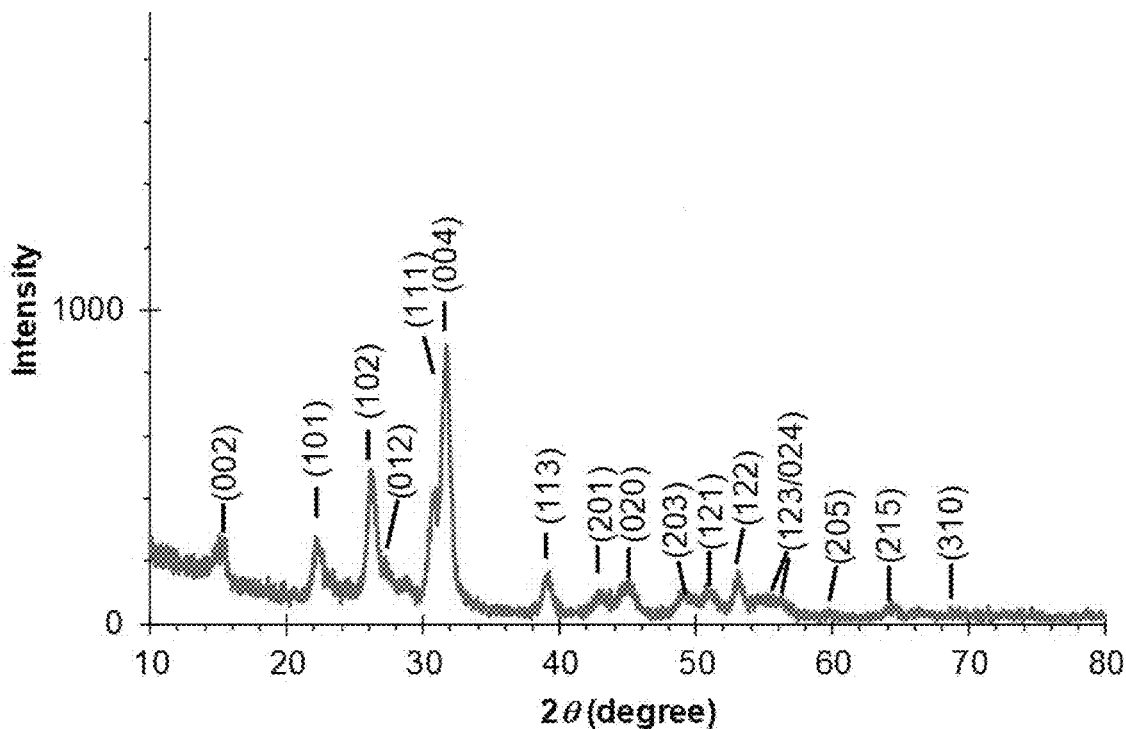
FIG. 8 illustrates an X-ray diffraction (XRD) spectrum of a tin sulfide film before being transferred in a method of transferring a tin sulfide film according to Example 1.

FIG. 8 illustrates an X-ray diffraction (XRD) spectrum of a tin sulfide film before being transferred in a method of transferring a tin sulfide film according to Example 1.

In FIG. 8, an XRD pattern of a SnS film formed on a silicon substrate before being transferred is illustrated. The XRD pattern shows the SnS film's Herzenbergite crystal characteristics and orthorhombic crystal symmetry characteristics having a Pbnm (62) space group and a lattice parameter of a=4.33 Å, b=3.98 Å and c=11.18 Å. Here, a main peak appears at 2θ=32 degrees corresponding to a (004) plane.

Figure 9:
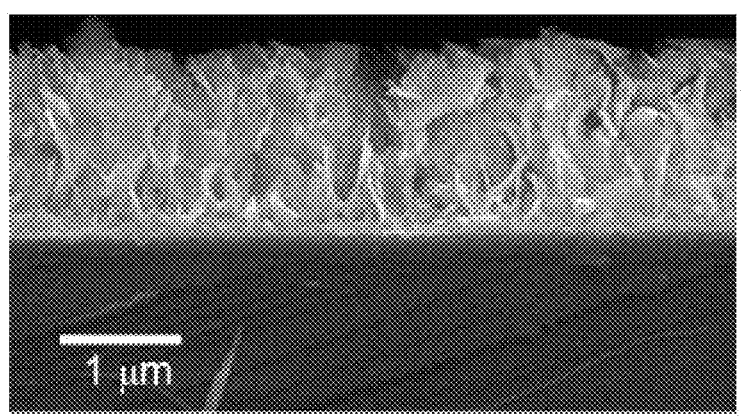
FIG. 9 is a field emission scanning electron microscope (FESEM) cross-sectional image of the tin sulfide film before being transferred in the method of transferring a tin sulfide film according to Example 1.
Figure 10:
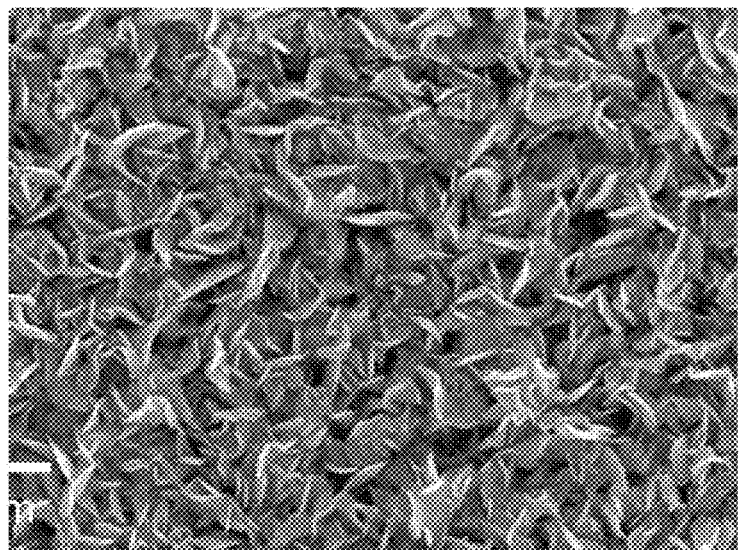
FIG. 10 is an FESEM surface image of the tin sulfide film before being transferred in the method of transferring a tin sulfide film according to Example 1.

FIG. 9 is a field emission scanning electron microscope (FESEM) cross-sectional image of the tin sulfide film before being transferred in the method of transferring a tin sulfide film according to Example 1. FIG. 10 is an FESEM surface image of the tin sulfide film before being transferred in the method of transferring a tin sulfide film according to Example 1.

In FIGS. 9 and 10, a SnS film grown vertically is shown.

Figure 11:
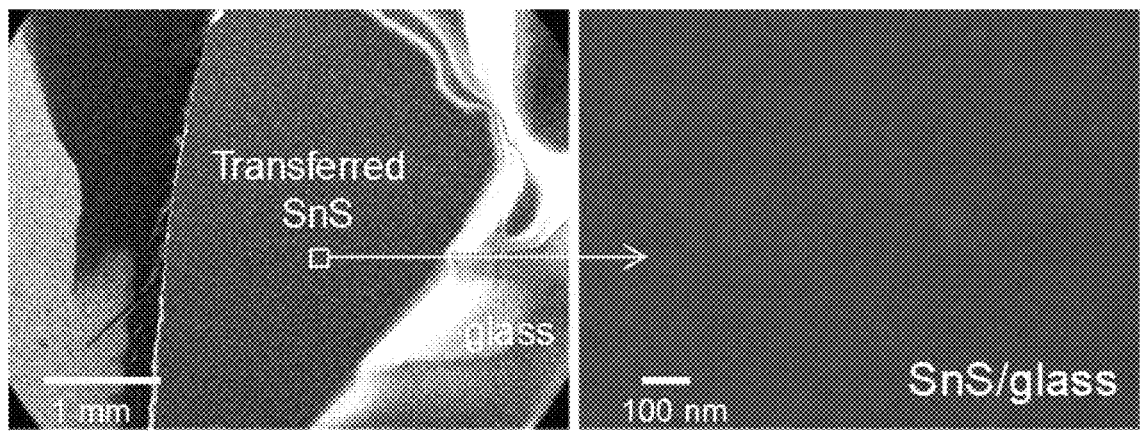
FIG. 11 is an FESEM surface image of a tin sulfide film and a substrate after the tin sulfide film is transferred in the method of transferring a tin sulfide film according to Example 1.
Figure 12:
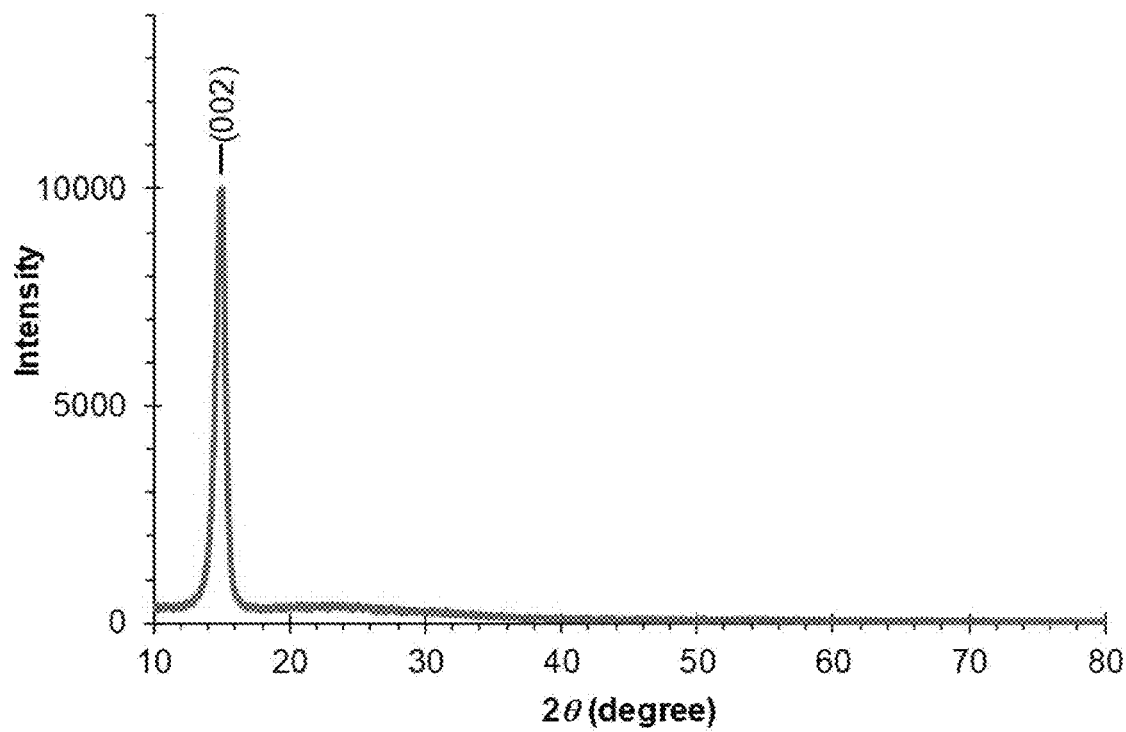
FIG. 12 illustrates an XRD spectrum of the tin sulfide film after being transferred in the method of transferring a tin sulfide film according to Example 1.
Figure 13:
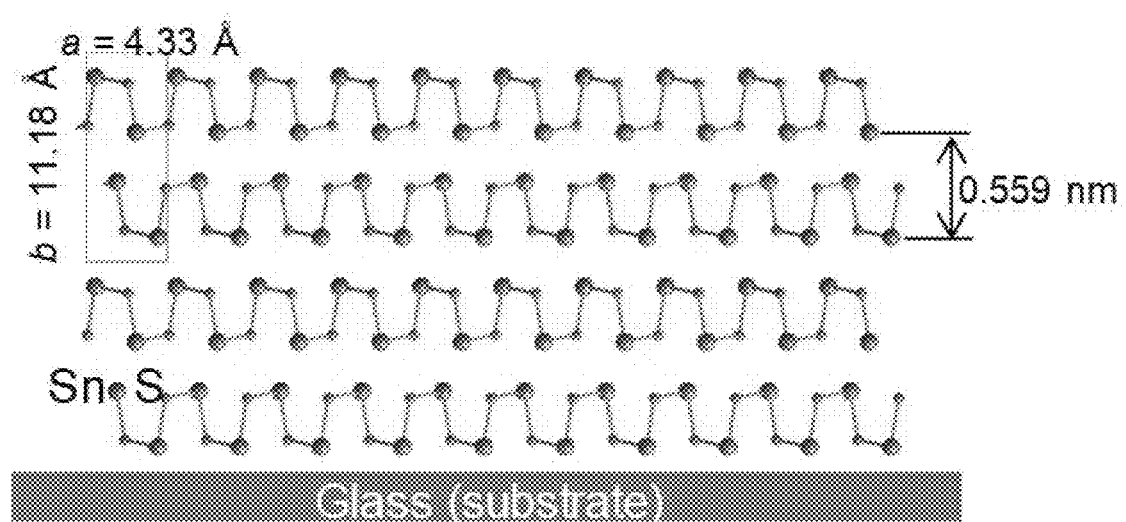
FIG. 13 is a conceptual diagram illustrating the molecular structure of the tin sulfide film after being transferred in the method of transferring a tin sulfide film according to Example 1.

FIG. 11 is an FESEM surface image of a tin sulfide film and a substrate after the tin sulfide film is transferred in the method of transferring a tin sulfide film according to Example 1. FIG. 12 illustrates an XRD spectrum of the tin sulfide film after being transferred in the method of transferring a tin sulfide film according to Example 1. FIG. 13 is a conceptual diagram illustrating the molecular structure of the tin sulfide film after being transferred in the method of transferring a tin sulfide film according to Example 1.

Referring to FIGS. 11 through 13, the thickness of the SnS film may be adjusted according to the duration of the RTP. In the method of transferring a tin sulfide film according to the current embodiments, the duration of the RTP may be between 5 and 35 minutes. Accordingly, the thickness of the SnS film transferred to the glass substrate may be 5 to 32 nm. However, the current embodiments are not limited to this case.

Referring to an XRD pattern of FIG. 12, a peak corresponding to a (002) plane is found only at 2θ=15 degrees. Referring to FIGS. 11 and 13, the SnS film on the glass substrate may be formed and grown as the (002) plane parallel to the glass substrate. The distance between a plurality of films in the SnS film on the glass substrate is determined corresponding to a lattice constant illustrated. The fact that the SnS film on the glass substrate has only a (002) plane peak demonstrates that the SnS film has advanced 2D material properties.

Figure 14:
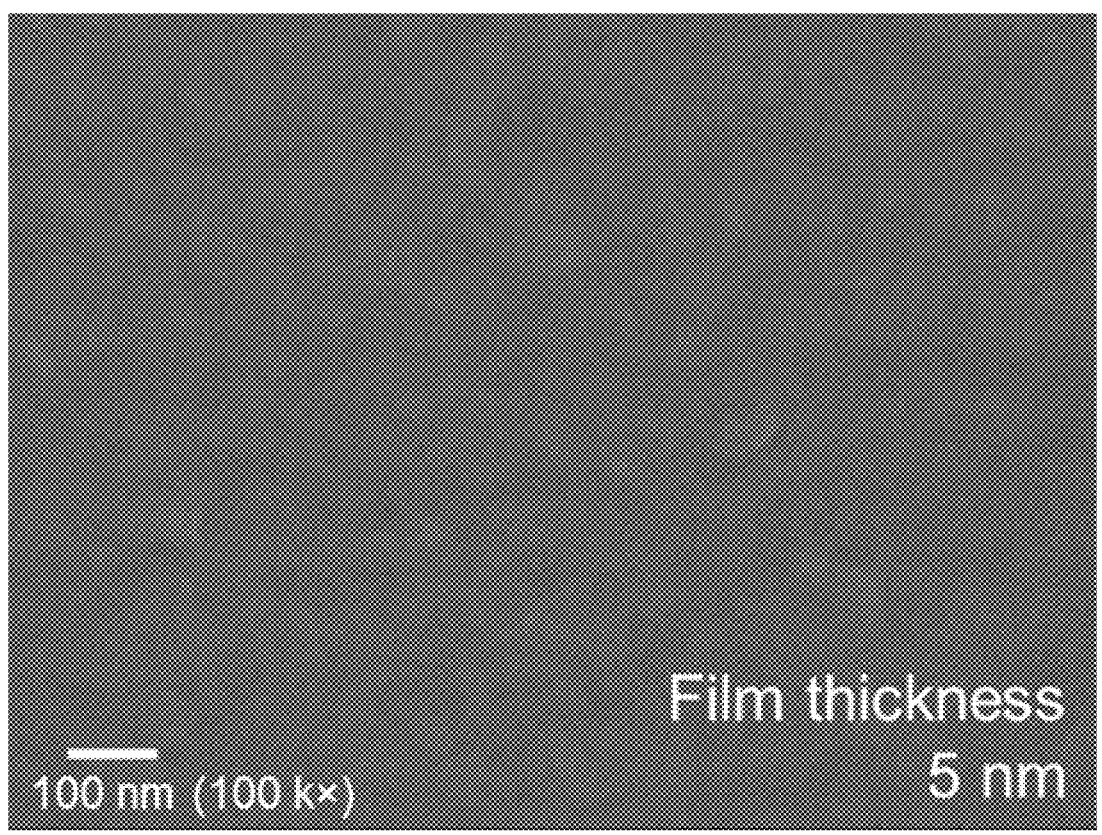
FIG. 14 is an FESEM image of the surface of a tin sulfide film according to Example 1.
Figure 15:
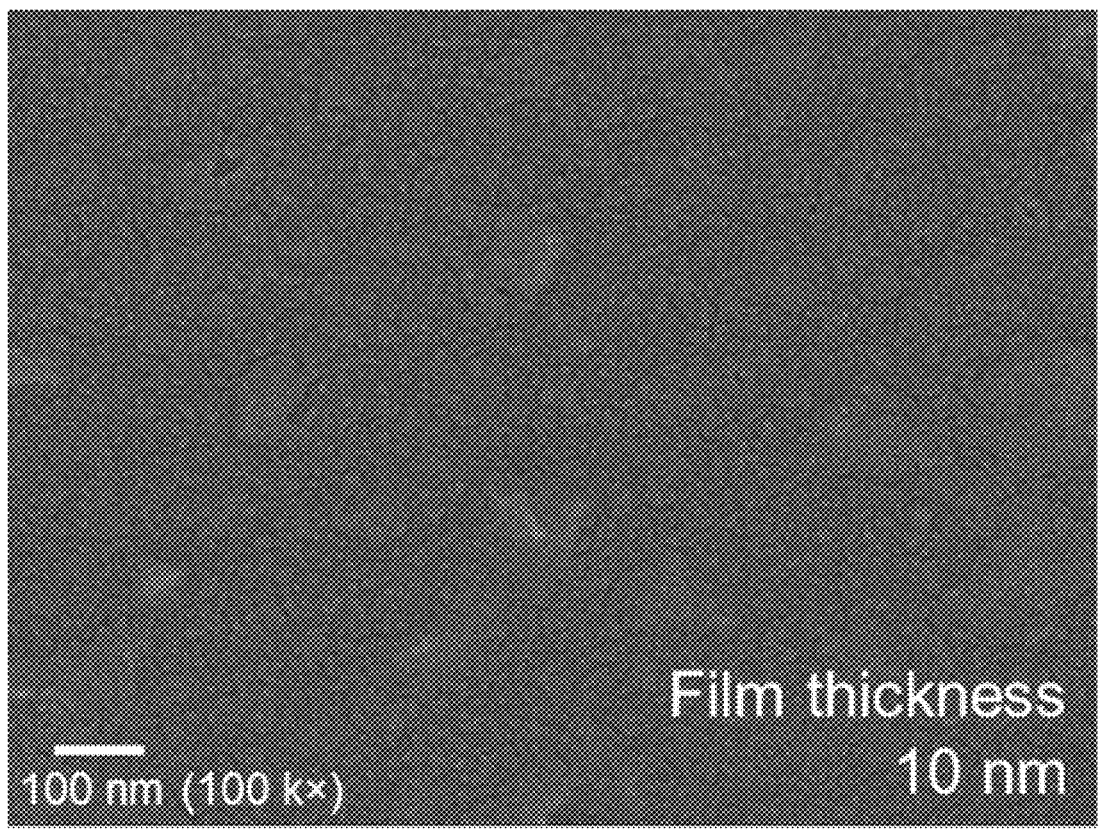
FIG. 15 is an FESEM image of the surface of a tin sulfide film according to Example 3.
Figure 16:
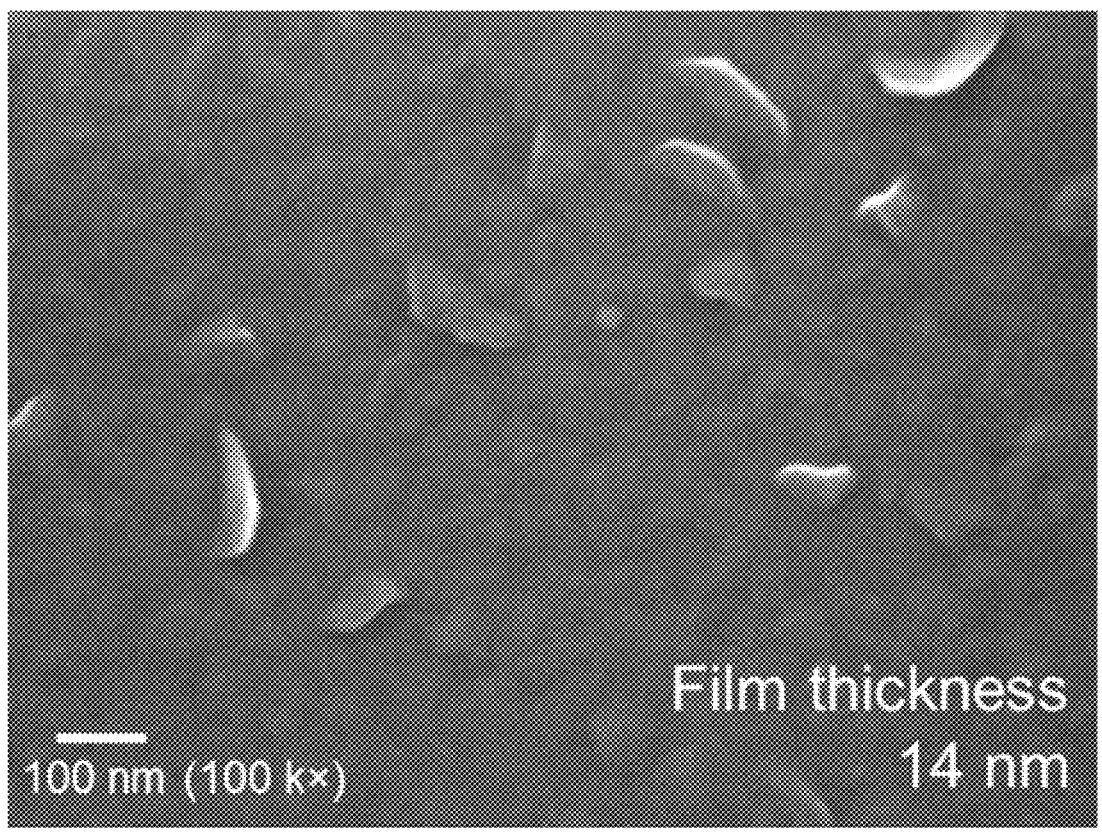
FIG. 16 is an FESEM image of the surface of a tin sulfide film according to Example 5.
Figure 17:
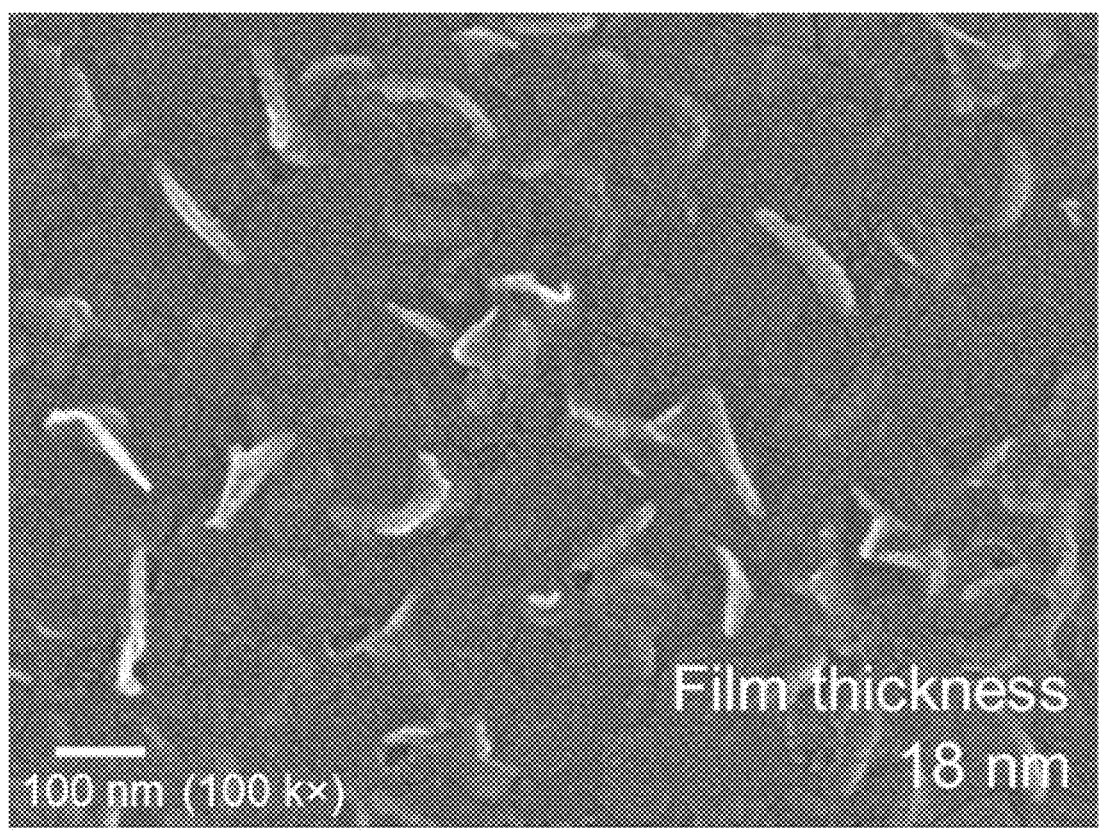
FIG. 17 is an FESEM image of the surface of a tin sulfide film according to Example 7.
Figure 18:
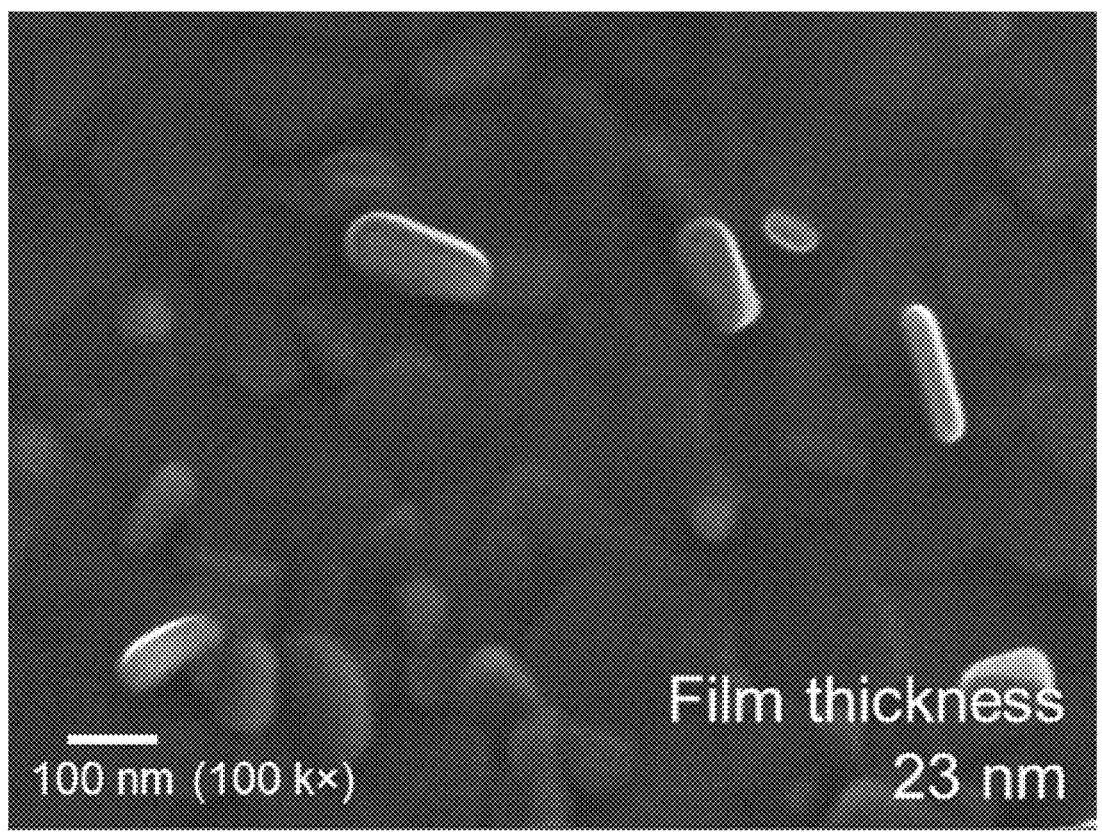
FIG. 18 is an FESEM image of the surface of a tin sulfide film according to Example 8.
Figure 19:
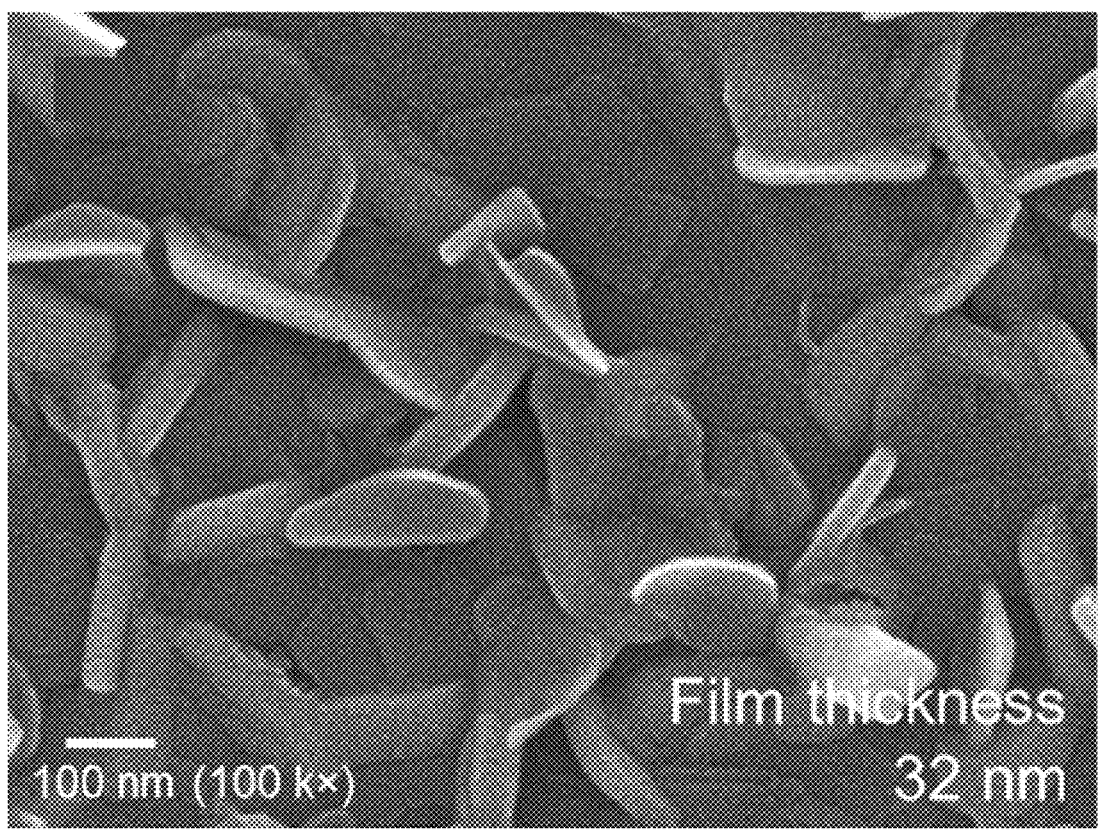
FIG. 19 is an FESEM image of the surface of a tin sulfide film according to Example 9.

FIG. 14 is an FESEM image of the surface of a tin sulfide film according to Example 1. FIG. 15 is an FESEM image of the surface of a tin sulfide film according to Example 3. FIG. 16 is an FESEM image of the surface of a tin sulfide film according to Example 5. FIG. 17 is an FESEM image of the surface of a tin sulfide film according to Example 7. FIG. 18 is an FESEM image of the surface of a tin sulfide film according to Example 8. FIG. 19 is an FESEM image of the surface of a tin sulfide film according to Example 9.

FIGS. 14 through 19, a SnS film transferred to a glass substrate by an RTP performed for 15 minutes or more may grow in an arbitrary direction on an upper surface to have a much rougher surface than a SnS film transferred to a glass substrate by an RTP performed for less than 15 minutes. The even surface of a SnS film transferred to a glass substrate by an RTP performed for less than 10 minutes may maintain flatness over a wide area. Therefore, such a SnS film may have enhanced 2D material properties and thus may be suitable for fabricating a photoelectric device.

Figure 20:
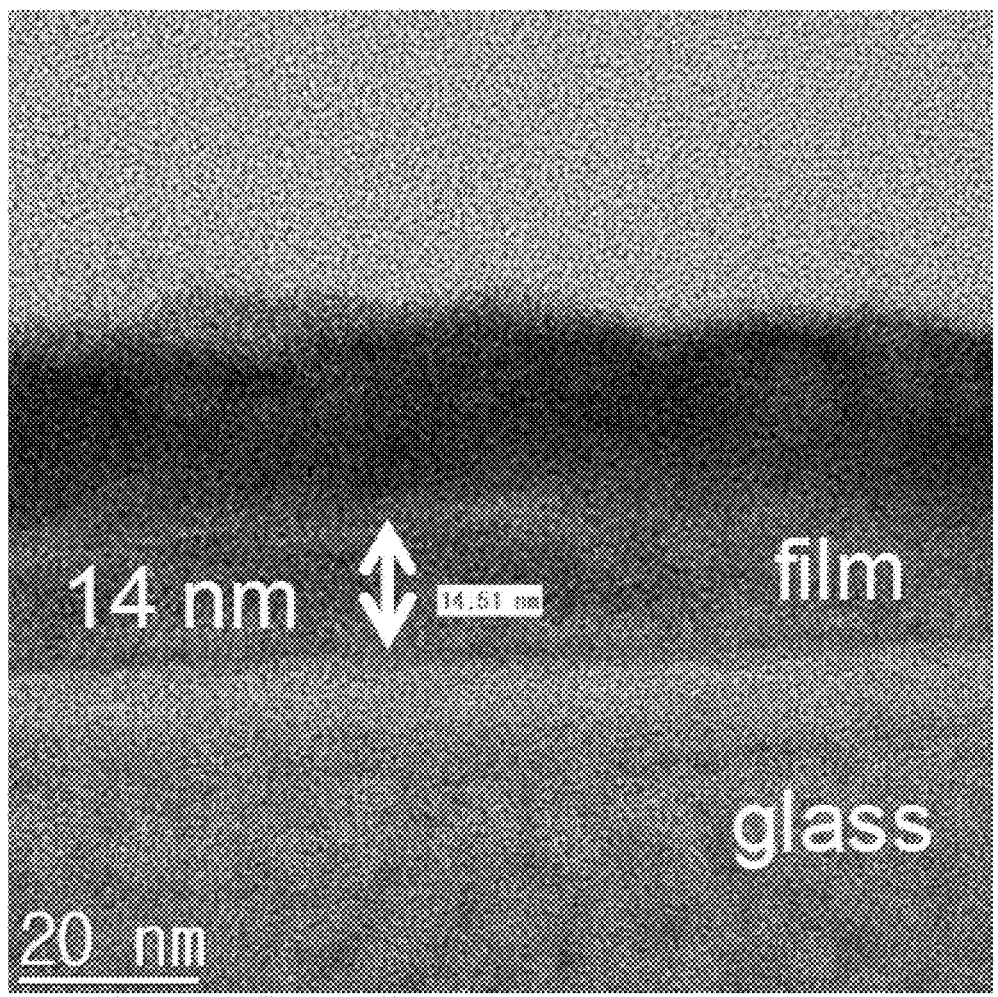
FIG. 20 is a cross-sectional transmission electron microscopy (TEM) image showing a cross section of a stacked structure of a tin sulfide film and a transparent substrate produced by a method of transferring a tin sulfide film according to Example 5.
Figure 21:
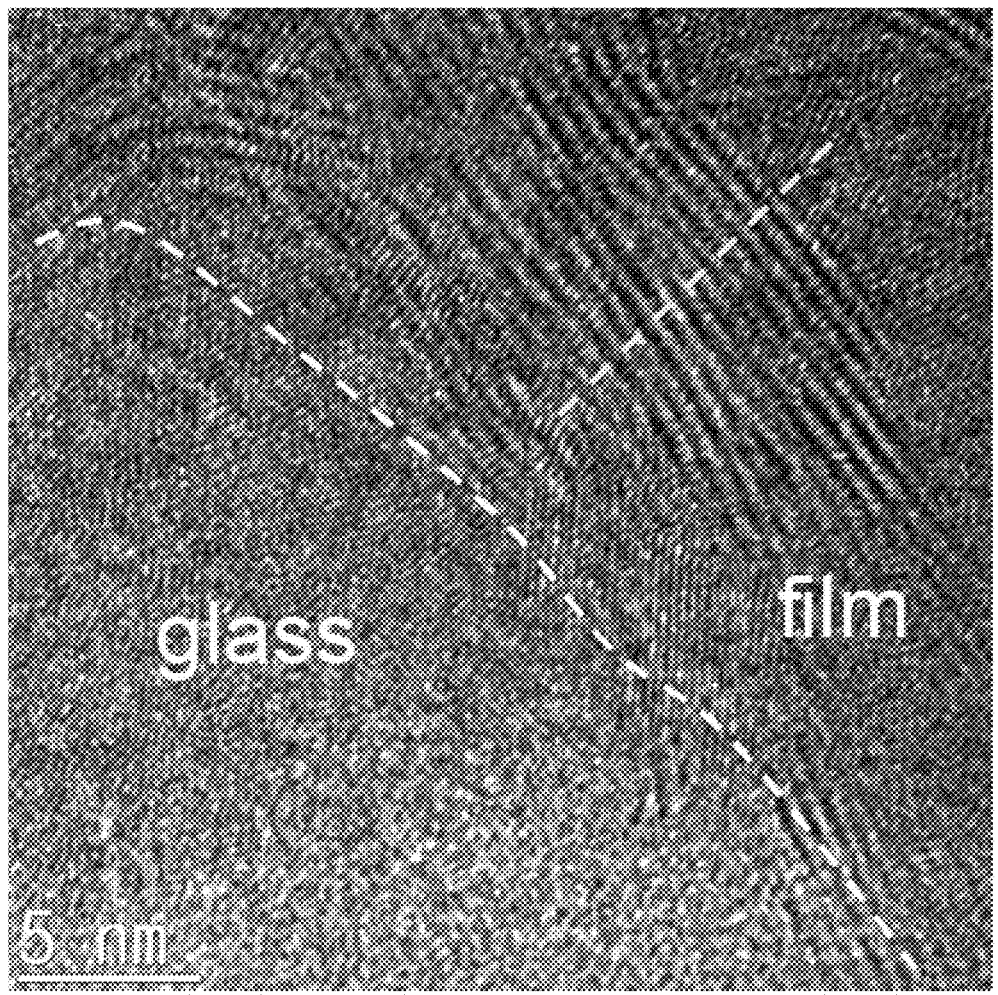
FIG. 21 is a cross-sectional high-resolution TEM (HR-TEM) image showing the overlap structure of a plurality of single films of the tin sulfide film produced by the method of transferring a tin sulfide film according to Example 5.

FIG. 20 is a cross-sectional transmission electron microscopy (TEM) image showing a cross section of a stacked structure of a tin sulfide film and a transparent substrate produced by the method of transferring a tin sulfide film according to Example 5. FIG. 21 is a cross-sectional high-resolution TEM (HRTEM) image showing the overlap structure of a plurality of single films of the tin sulfide film produced by the method of transferring a tin sulfide film according to Example 5.

In FIGS. 20 and 21, the detailed thickness and lattice structure of a SnS film transferred to a glass substrate produced by the method of transferring a tin sulfide film according to Example 5 are shown. Referring to FIG. 20, it can be seen that the thickness of the SnS film is about 15 nm. Referring to FIG. 21, it can be seen that the transferred SnS film is disposed parallel to the surface of the glass substrate.

Figure 22:
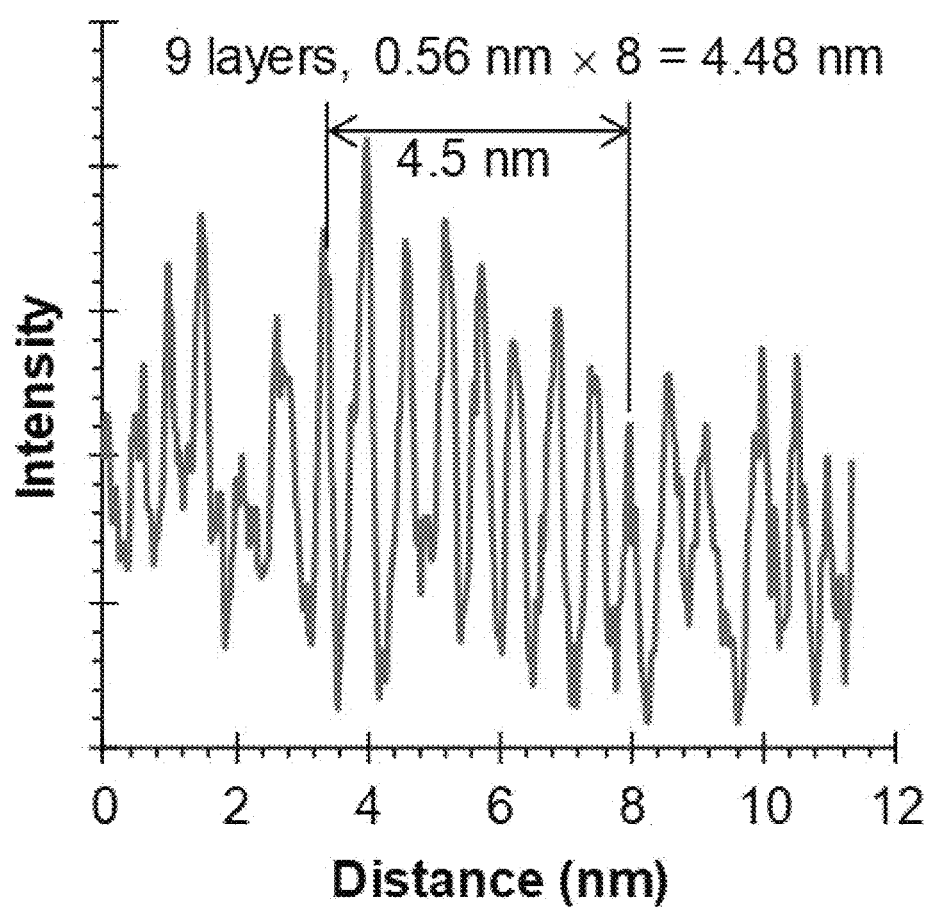
FIG. 22 illustrates a profile according to thickness to explain the overlap structure of a plurality of single films of a tin sulfide film according to Example 5.

FIG. 22 illustrates a profile according to thickness to explain the overlap structure of a plurality of single films of a tin sulfide film according to Example 5. FIG. 22 is a profile measured along a yellow line in FIG. 21.

In FIG. 22, periodic oscillations having a period of 0.56 nm are illustrated. It can be seen that each oscillation corresponds to a single SnS film having a thickness corresponding to the lattice constant of FIG. 13. In this case, up to nine SnS single films may be stacked to have a thickness of 4.5 nm.

Figure 23:
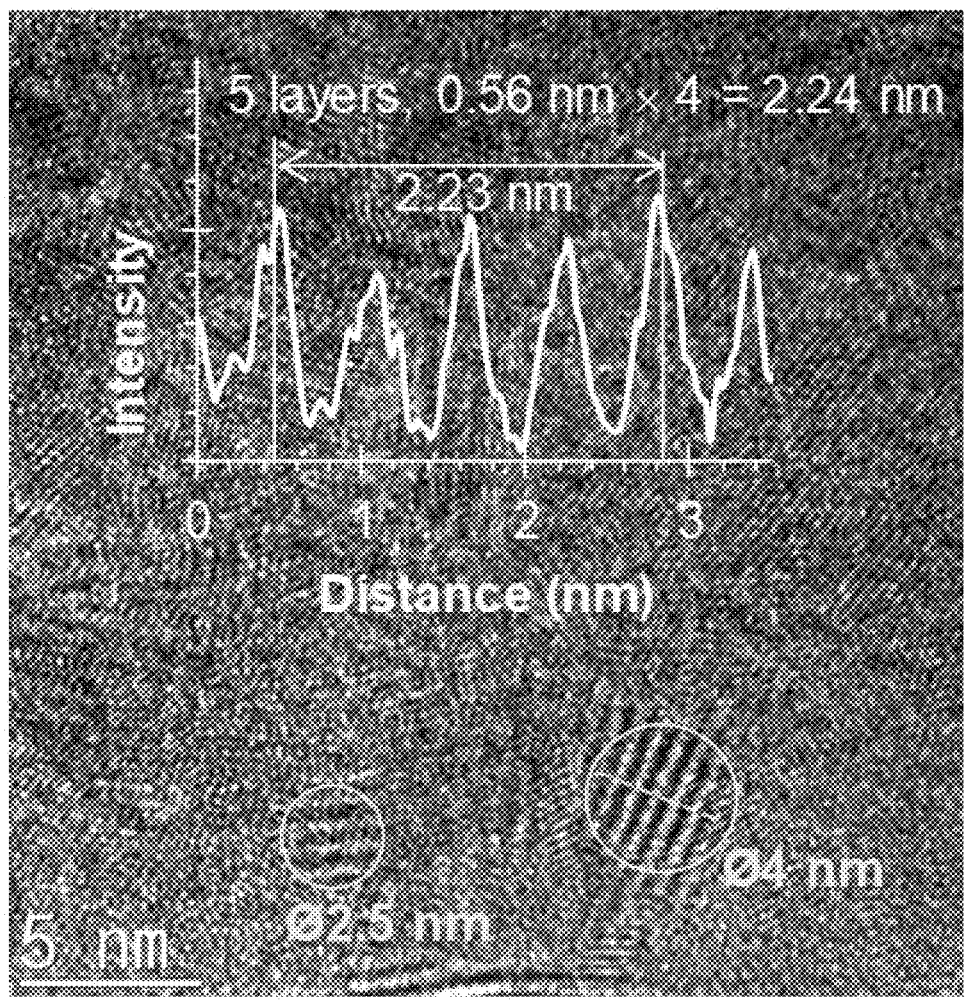
FIG. 23 shows an HRTEM image of a quantum dot structure to explain the overlap structure of a plurality of single films of a tin sulfide film according to Example 5.

FIG. 23 shows an HRTEM image of a quantum dot structure to explain the overlap structure of a plurality of single films of a tin sulfide film according to Example 5.

Referring to FIG. 23, a transferred SnS film may also include SnS particles having a diameter of 2.5 to 4 nm in which a plurality of SnS single films overlap each other. As illustrated in FIG. 23, a line profile of a 4 nm particle indicates that the SnS particle is a 2D material structure in which five layers of a SnS single film are each stacked to a uniform thickness of 0.56 nm.

A rapid thermal transfer of a SnS film may be performed by sublimating each SnS platelet from a silicon substrate and re-depositing it on a glass substrate facing the silicon substrate. Since the glass substrate and the silicon substrate are very close to each other, equilibrium may be formed between the surfaces of the glass substrate and the silicon substrate. Therefore, the sublimated SnS platelets can be rearranged through uniform and directional growth within the thickness range of several SnS single films.

The SnS film transferred onto the glass substrate may remain in the atmosphere. The perfect stacking of the SnS film transferred onto the glass substrate may maximize the van der Waals interactions between the SnS single films, and this structural property may contribute to film stability.

Therefore, the method of transferring a tin sulfide film according to the present disclosure is a very useful for transferring a SnS film grown on a large-scale, i.e., a wafer-scale to another substrate and does not change the original lattice structure of the SnS film at all.

Figure 24:
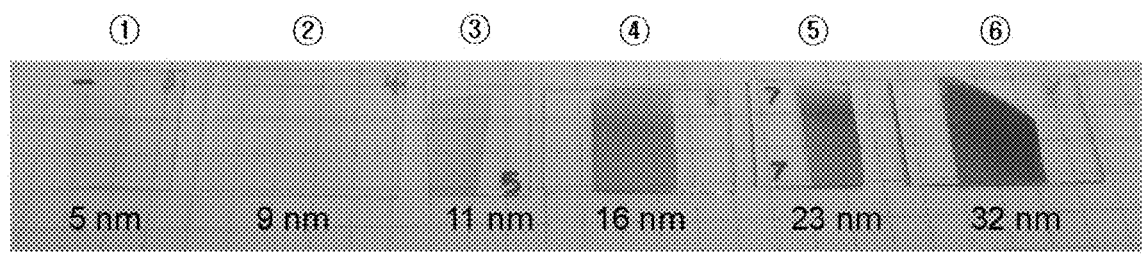
FIG. 24 is an image showing tin sulfide films transferred by methods of transferring a tin sulfide film according to Examples 1, 2, 4, 6, 8 and 9.

FIG. 24 is an image showing tin sulfide films transferred by the methods of transferring a tin sulfide film according to Examples 1, 2, 4, 6, 8 and 9.

In FIG. 24, SnS films on glass substrates produced according to Example 1 (①), Example 2 (②), Example 4 (③), Example 6 (④), Example 8 (⑤) and Example 9 (⑥) are shown. An RTP was performed for 5 minutes, 10 minutes, 16 minutes, 20 minutes, 25 minutes and 35 minutes in Example 1 (①). Example 2 (②), Example 4 (③), Example 6 (④), Example 8 (⑤) and Example 9 (⑥), respectively.

Figure 25:
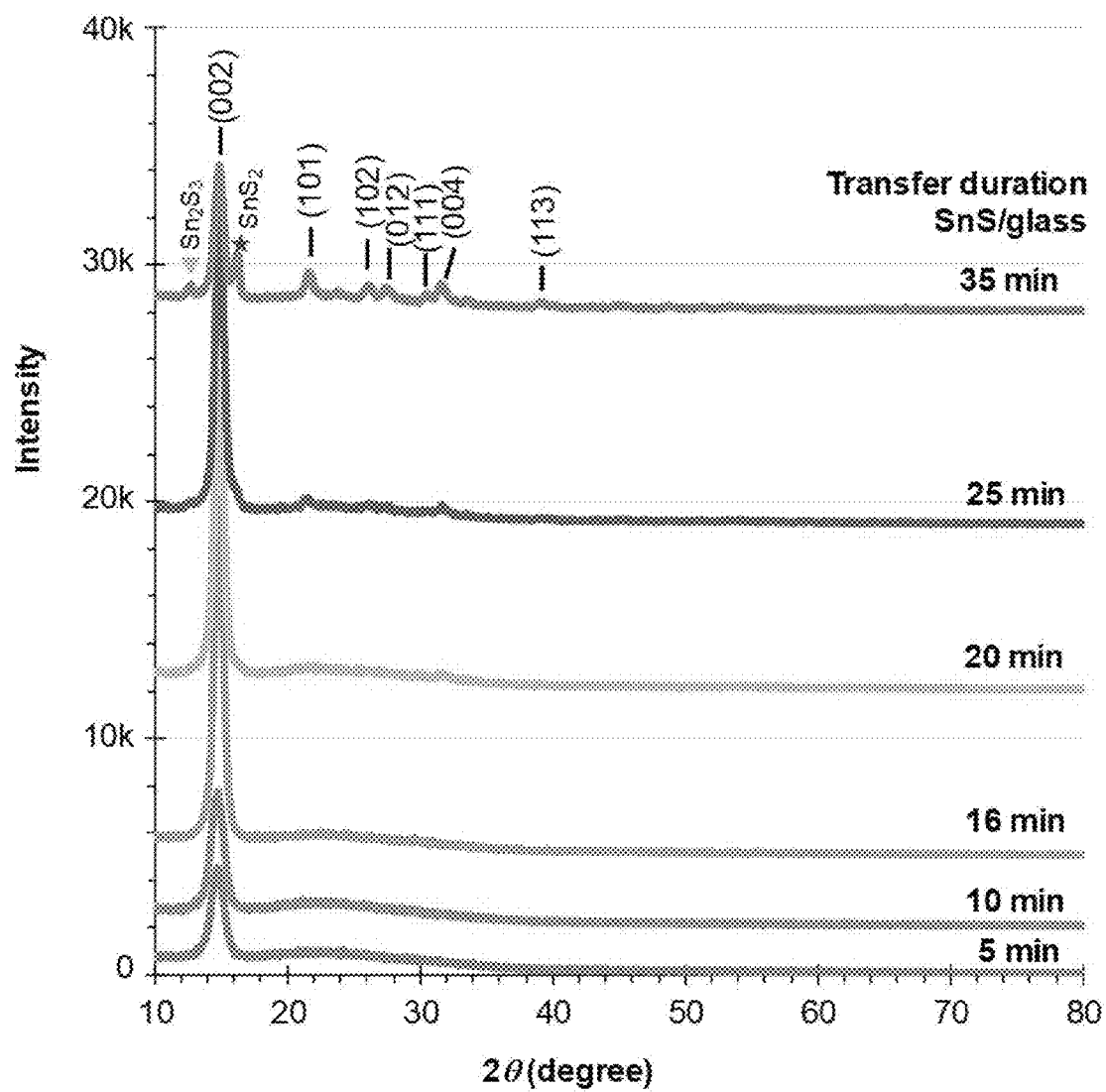
FIG. 25 illustrates XRD patterns of tin sulfide films transferred by the methods of transferring a tin sulfide film according to Examples 1, 2, 4, 6, 8 and 9.

FIG. 25 illustrates XRD patterns of the tin sulfide films transferred by the methods of transferring a tin sulfide film according to Examples 1, 2, 4, 6, 8 and 9.

Referring to FIG. 25, a strong (002) peak is observed. The strong (002) peak indicates that a SnS platelet having a (002) plane with a large area is preferentially oriented parallel to the surface of a glass substrate. In addition, the position of the peak does not change as the thickness of the SnS film increases. This indicates that the original lattice structure does not change with thickness and that no deformation of the lattice structure occurs during a transfer process.

If the transfer duration, that is, the duration of the RTP, is increased to 25 minutes or more, a SnS film having an increased proportion of randomly oriented SnS plates other than the (002) peak may be formed. A full width at half maximum (FWHM) is maintained at about 1.2 for SnS films up to 10 in thick and gradually decreases to 0.8 as the thickness increases beyond 32 nm.

Figure 26:
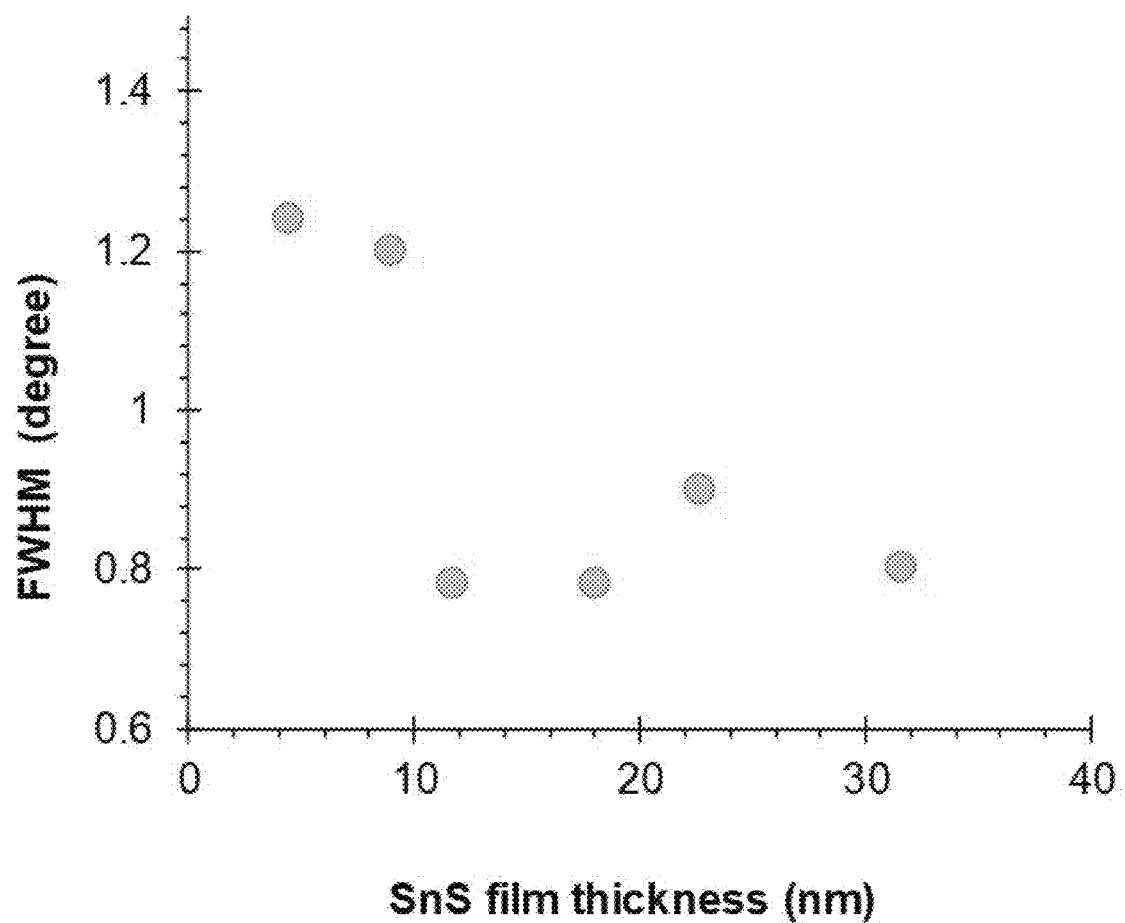
FIG. 26 is a graph illustrating the full widths at half maximum (FWHMs) of (002) peaks of the XRD patterns of the tin sulfide films transferred by the methods of transferring a tin sulfide film according to Examples 1, 2, 4, 6, 8 and 9.

FIG. 26 is a graph illustrating the FWHMs of the (002) peaks of the XRD patterns of the tin sulfide films transferred by the methods of transferring a tin sulfide film according to Examples 1, 2, 4, 6, 8 and 9.

Referring to FIG. 26, the difference between a case where the thickness of a SnS film is 10 nm or less and a case where the thickness of the SnS film is more than 10 n can be seen.

Figure 27:
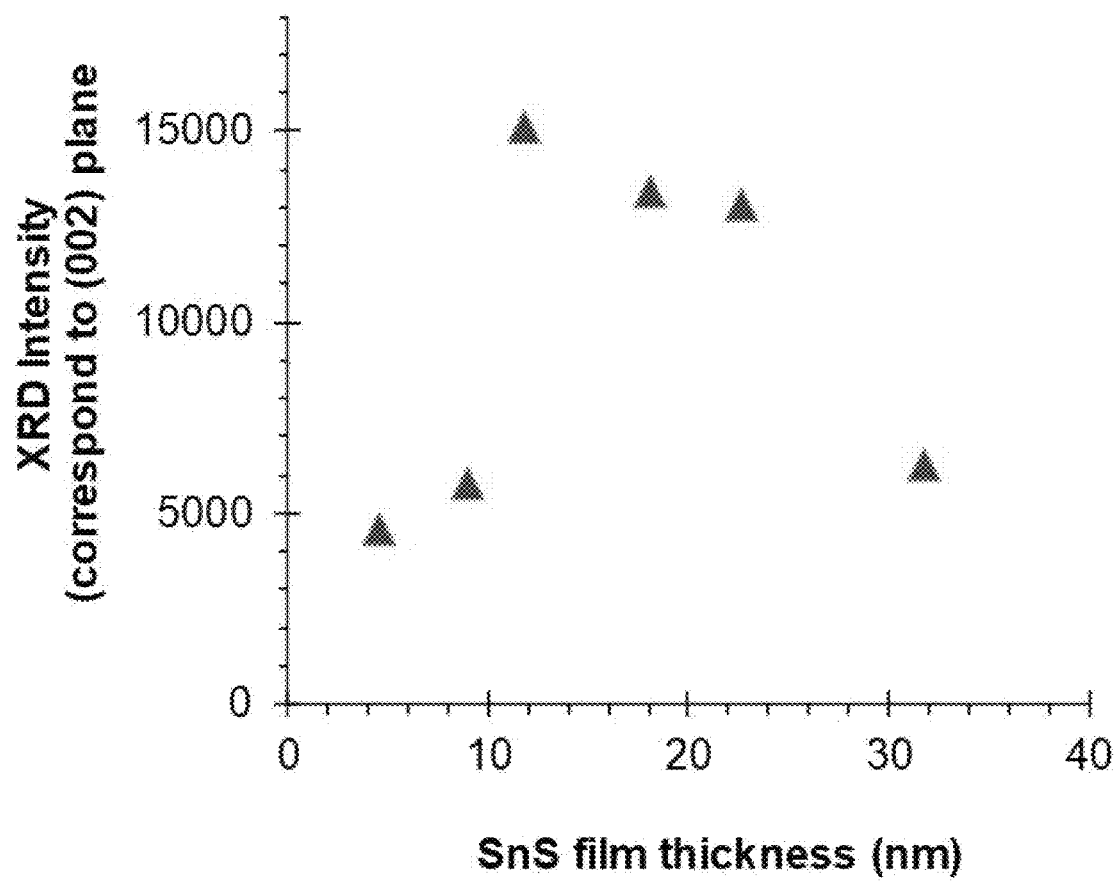
FIG. 27 is a graph illustrating the magnitudes of the (002) peaks of the XRD patterns of the tin sulfide films transferred by the methods of transferring a tin sulfide film according to Examples 1.2, 4, 6, 8 and 9.

FIG. 27 is a graph illustrating the magnitudes of the (002) peaks of the XRD patterns of the tin sulfide films transferred by the methods of transferring a tin sulfide film according to Examples 1.2, 4, 6, 8 and 9.

Referring to FIG. 27, when the thickness of a SnS film is between 10 and 25 In, a strong peak corresponding to the (002) plane is observed. This means that the degree of alignment of the SnS film formed parallel to the surface of a glass substrate is highest when the thickness of the SnS film is between 10 and 25 nm.

Figure 28:
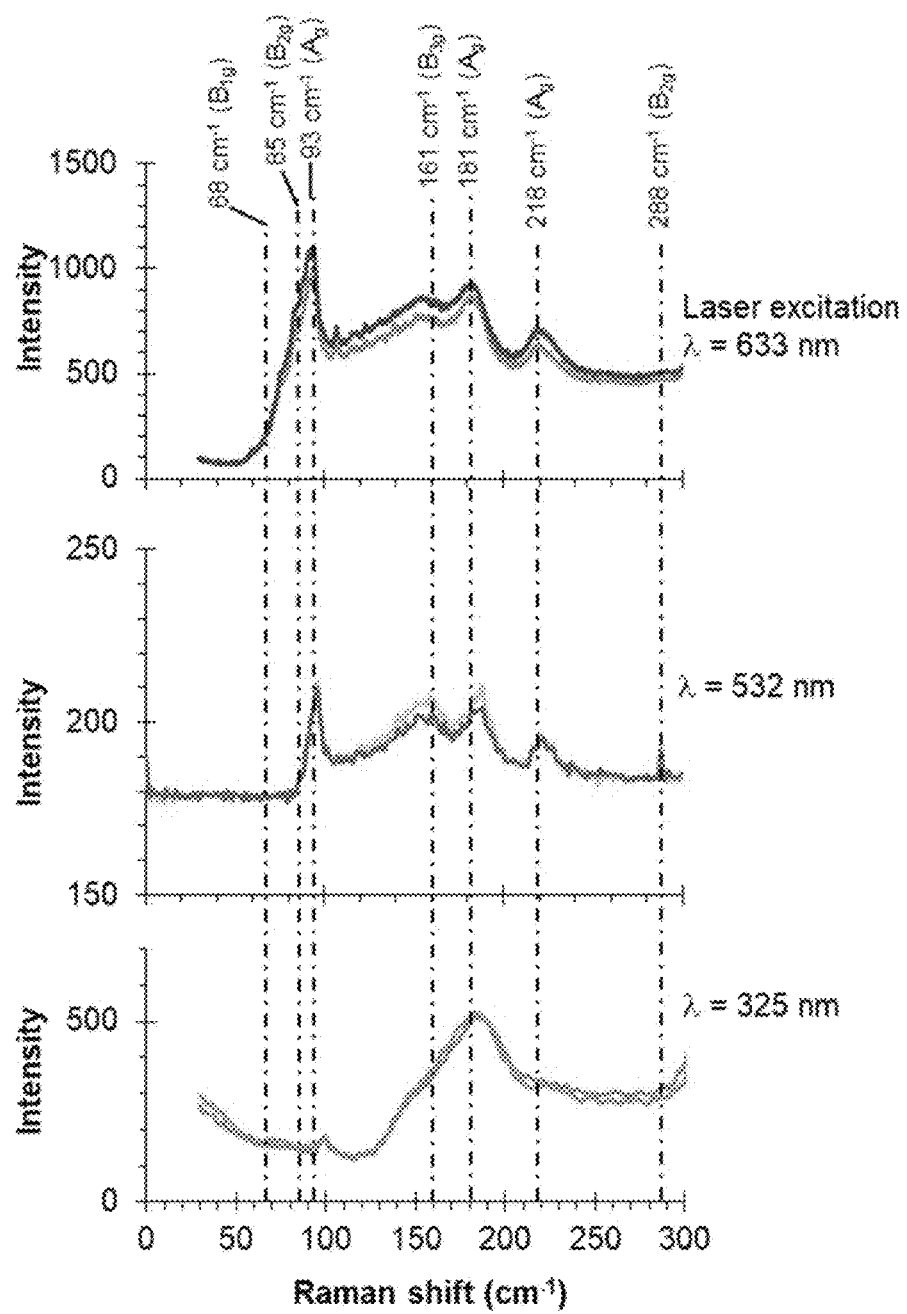
FIG. 28 illustrates Raman spectra of a tin sulfide film transferred by a method of transferring a tin sulfide film according to embodiments.

FIG. 28 illustrates Raman spectra of a tin sulfide film transferred by a method of transferring a tin sulfide film according to embodiments.

Referring to FIG. 28, the Raman spectra of a transferred SnS film were measured with lasers of different wavelengths (325, 532 and 633 nm). The result indicates that different Raman properties can be obtained at different Raman wavelengths. FIG. 28 illustrates the Raman spectra of a SnS film transferred by an RTP performed for 15 minutes. In particular, in FIG. 28, it can be seen that the Raman spectrum at the laser of 633 nm generates an intense Raman peak corresponding to the SnS film, which varies according to the thickness of the SnS film.

Figure 29:
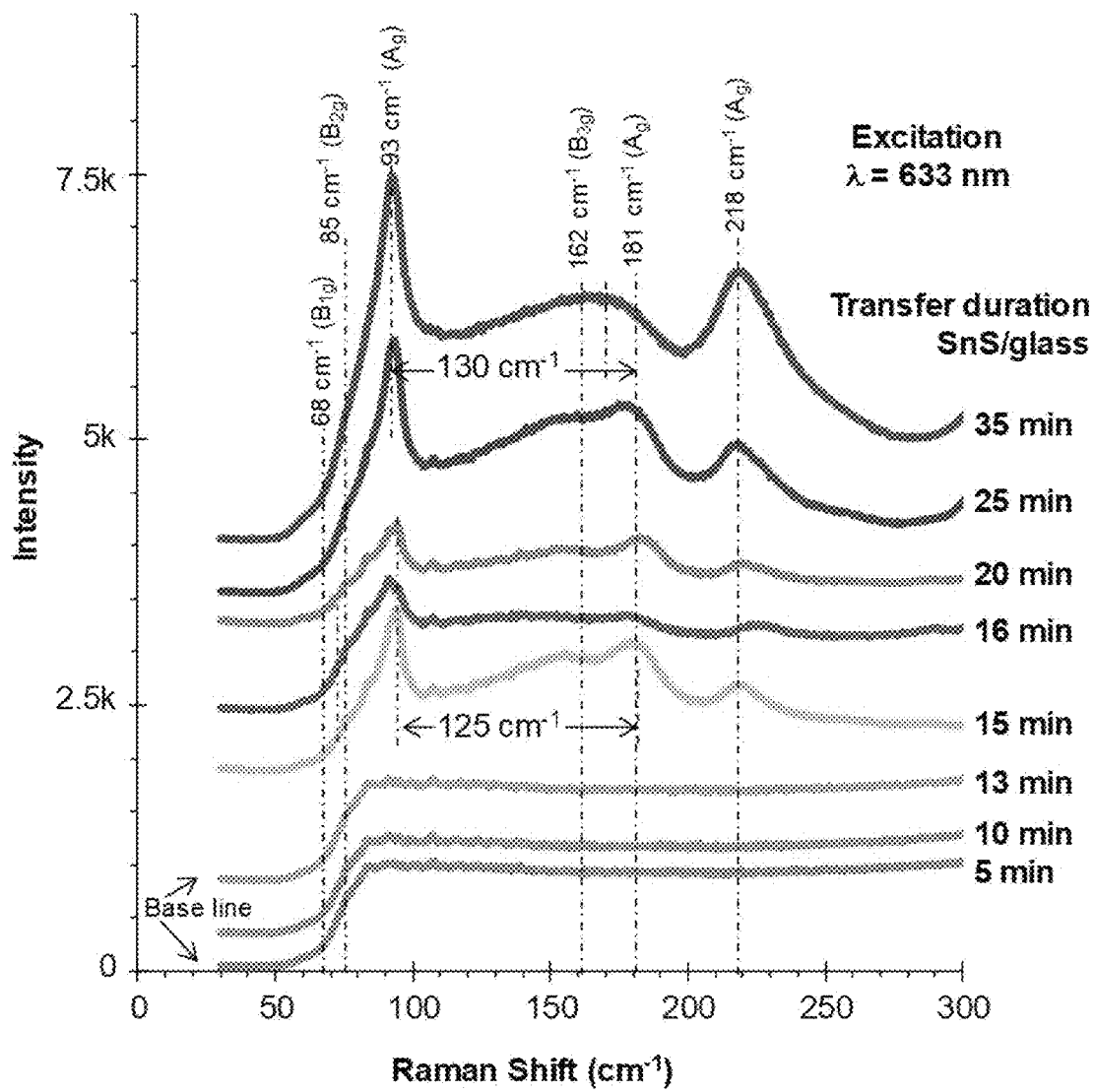
FIG. 29 illustrates Raman spectra of tin sulfide films transferred by the methods of transferring a tin sulfide film according to Examples 1, 2 and 4 through 9.

FIG. 29 illustrates Raman spectra of tin sulfide films transferred by the methods of transferring a tin sulfide film according to Examples 1, 2 and 4 through 9.

In FIG. 29, four different Raman active modes of a SnS film, that is, $A_g$ (93, 181, 218 cm$^{-1}$), $B_{1g}$ (68 cm$^{-1}$), $B_{2g}$ (85 and 288 cm$^{-1}$) and $B_{3g}$ (162 cm$^{-1}$) are illustrated. These peaks appear only in SnS films with a thickness of 13 in or more.

A blue shift in which the $A_g$ peak shifts from 91 cm$^{-1}$ to 96 cm$^{-1}$ may be caused by reduced inter-film interactions due to a reduced number of SnS single films. A change in Raman absorption mode caused by a change in the number of single films can be explained from a change in dielectric screening of long-range Coulomb forces. This thickness-dependent change in the Raman mode is also observed in a SnS thin film grown directly on an FTO substrate.

Figure 30:
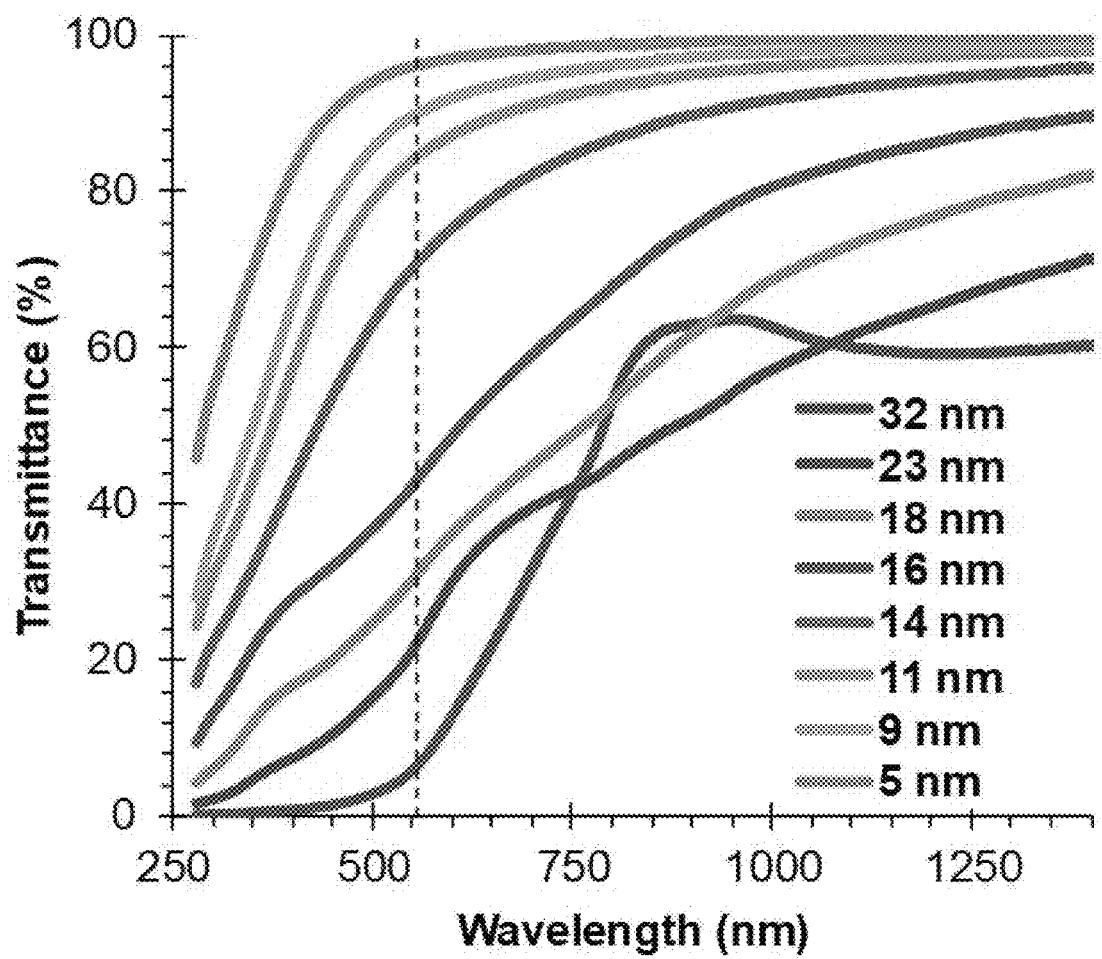
FIG. 30 is a graph illustrating transmittances of the tin sulfide films transferred by the methods of transferring a tin sulfide film according to Examples 1, 2 and 4 through 9.

FIG. 30 is a graph illustrating transmittances of the tin sulfide films transferred by the methods of transferring a tin sulfide film according to Examples 1, 2 and 4 through 9.

Referring to FIG. 30, a 23 nm-thick SnS film of Example 8 exhibits a transmittance of 22% at incident light with a wavelength of 555 nm, whereas a 5 nm-thick SnS film of Example 1 exhibits a high transmittance of 96% at the incident light with the wavelength of 555 nm.

Figure 31:
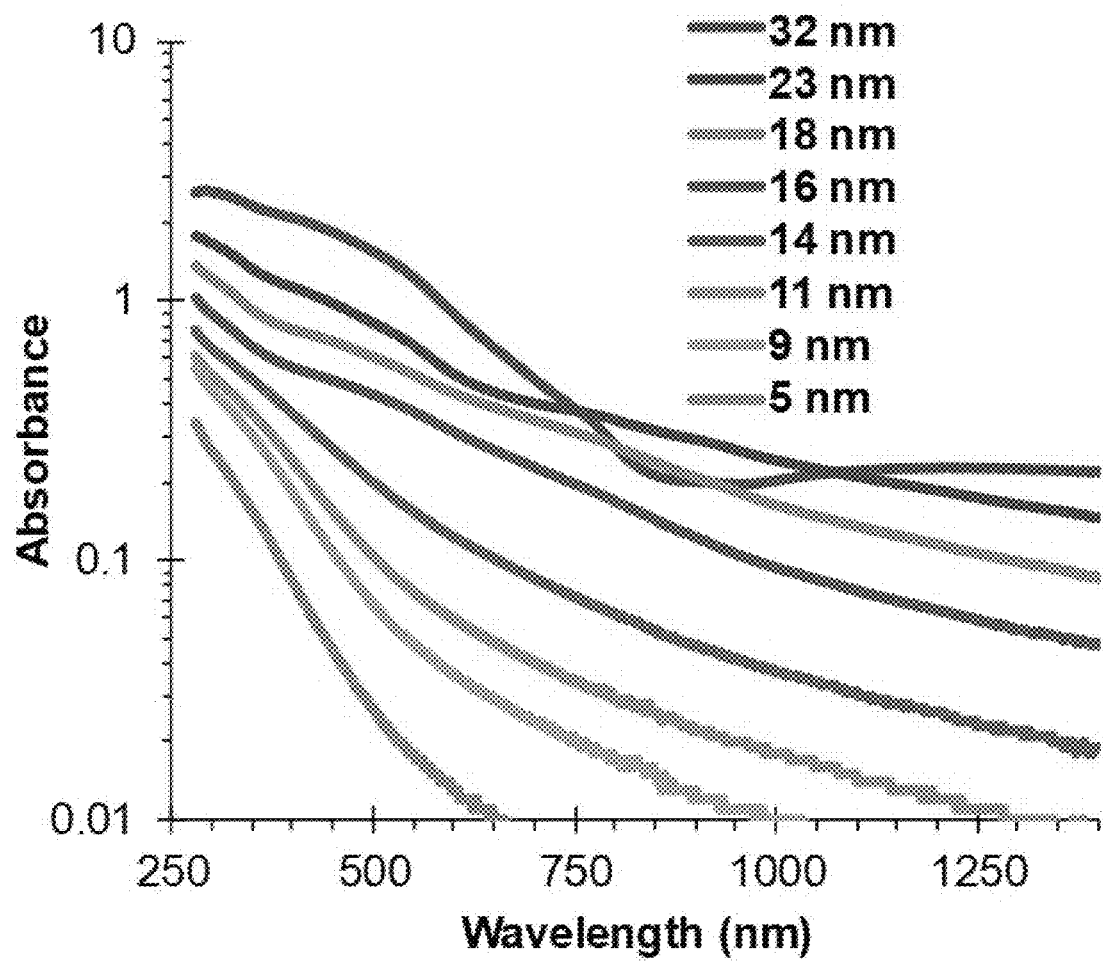
FIG. 31 is a graph illustrating absorbances of the tin sulfide films transferred by the methods of transferring a tin sulfide film according to Examples 1, 2 and 4 through 9.

FIG. 31 is a graph illustrating absorbances of the tin sulfide films transferred by the methods of transferring a tin sulfide film according to Examples 1.2 and 4 through 9.

Referring to FIG. 31, absorbance spectra show that the absorbance extends toward a longer wavelength as the thickness increases to 5 to 32 nm, which denotes a reduction of an optical bandgap Eg.

Figure 32:
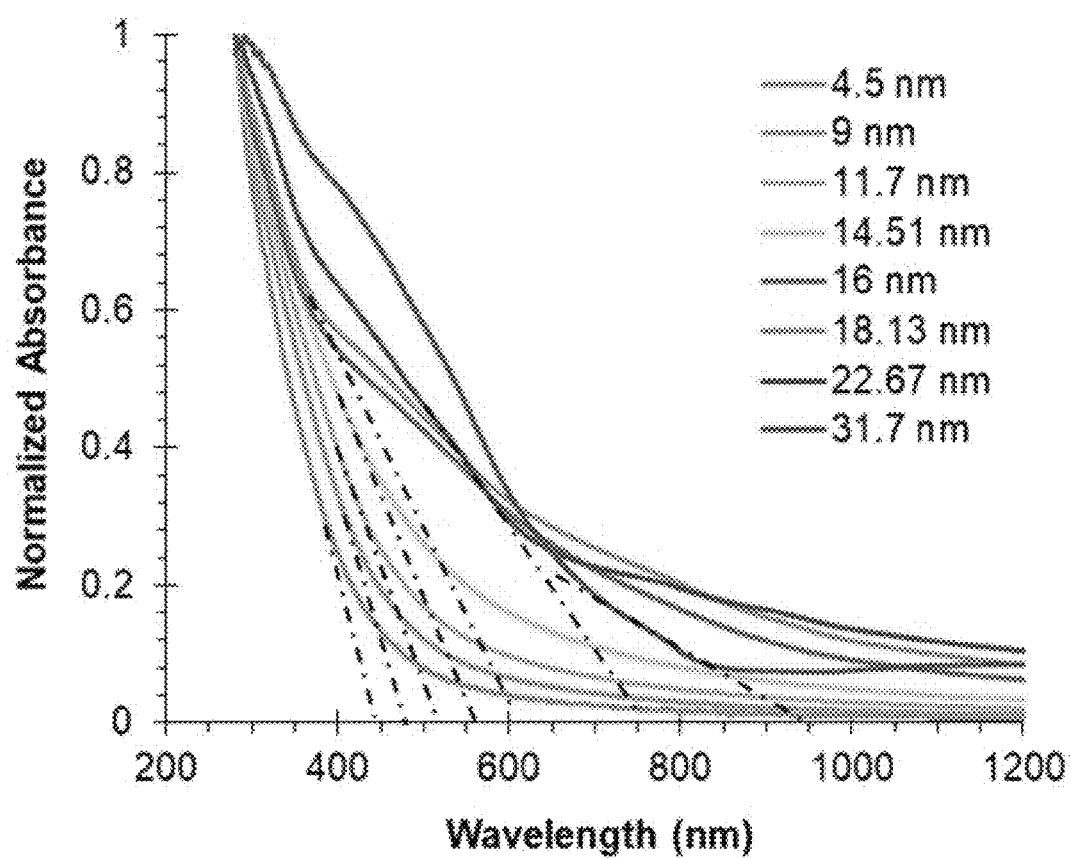
FIG. 32 is a graph illustrating normalized absorbance with respect to the thickness of a tin sulfide film transferred by a method of transferring a tin sulfide film according to embodiments.
Figure 33:
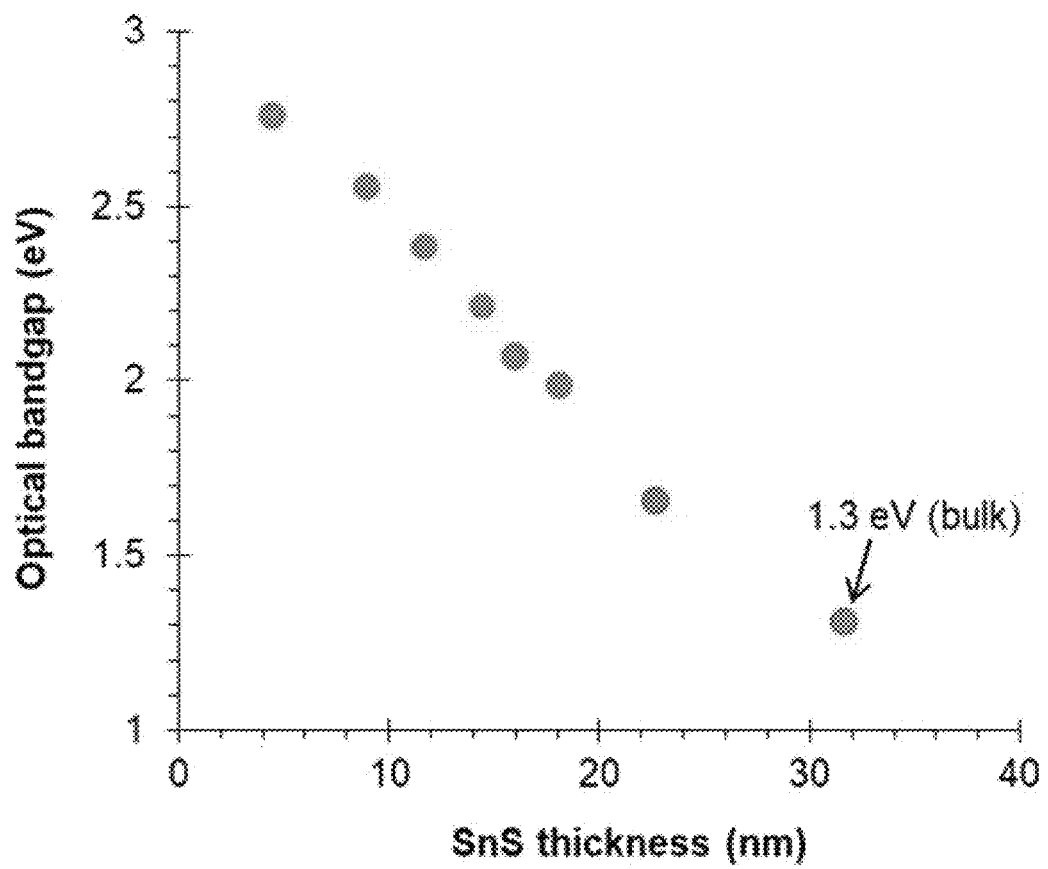
FIG. 33 is a graph illustrating bandgap with respect to the thickness of the tin sulfide film transferred by the method of transferring a tin sulfide film according to the embodiments.

FIG. 32 is a graph illustrating normalized absorbance with respect to the thickness of a tin sulfide film transferred by a method of transferring a tin sulfide film according to the embodiments. FIG. 33 is a graph illustrating bandgap with respect to the thickness of the tin sulfide film transferred by the method of transferring a tin sulfide film according to the embodiments.

Referring to FIGS. 32 and 33, the graph of Eg with respect to the thickness of a SnS film shows that Eg of 2.8 eV at a thickness of 5 n decreases to 1.3 eV (bulk) at 32 nm. This is in agreement with theoretical figures. In addition, a shift current due to spontaneous polarization in the SnS film provides broadband optical response.

Figure 34:
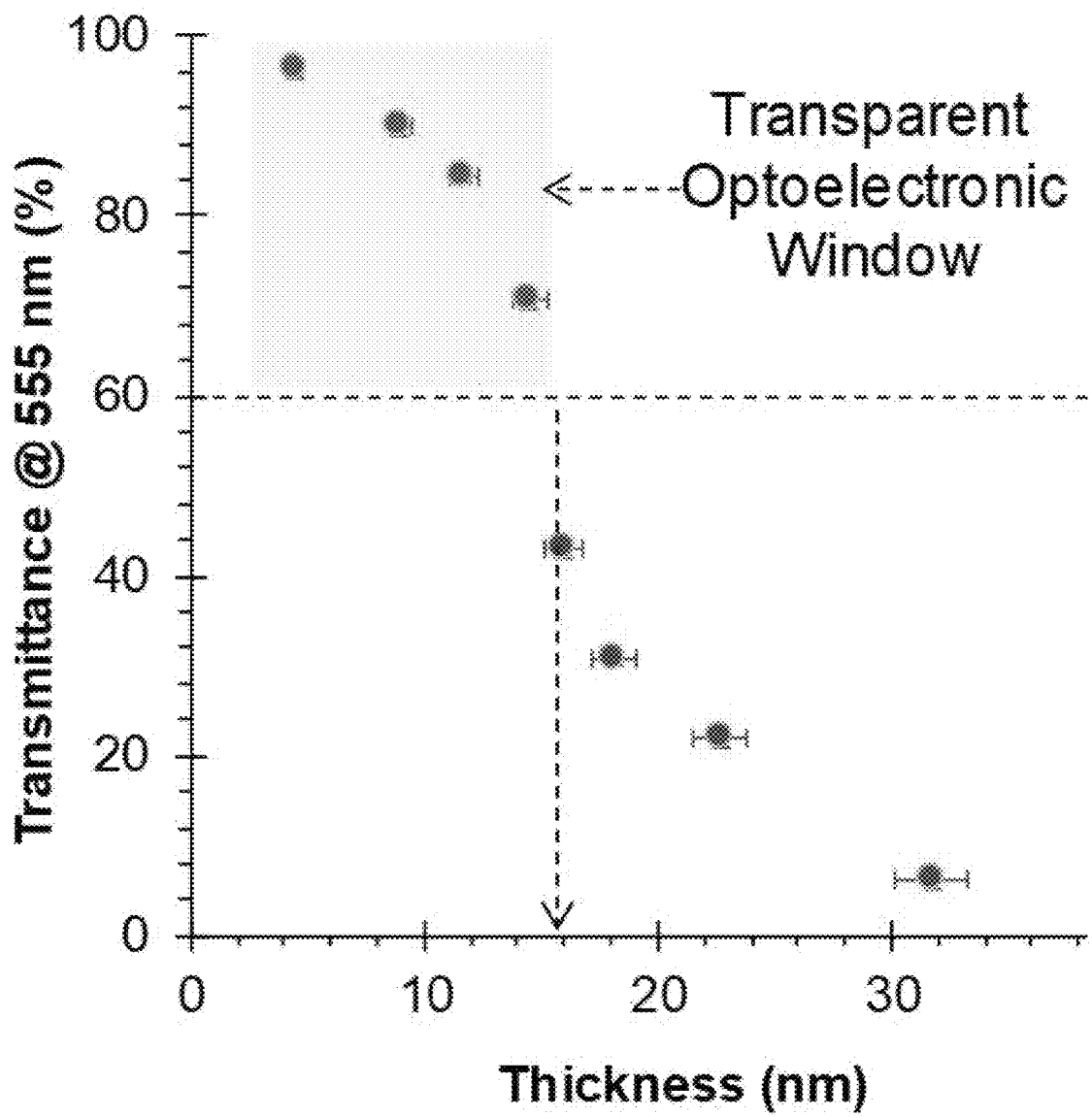
FIG. 34 is a graph illustrating the transmittances, at incident light of 555 nm, of the tin sulfide films transferred by the methods of transferring a tin sulfide film according to Examples 1, 2 and 4 through 9.

FIG. 34 is a graph illustrating the transmittances, at incident light of 555 nm, of the tin sulfide films transferred by the methods of transferring a tin sulfide film according to Examples 1, 2 and 4 through 9.

Referring to FIG. 34, it can be seen that the transmittance sharply decreases at about 15 nm. Therefore, since a transmittance of less than 60% is desirable for a transparent photoelectric device, a SnS film having a thickness of less than 15 nm may be used for the photoelectric device.

A photoelectric device according to embodiments will now be described with reference to FIGS. 35 through 54.

Figure 35:
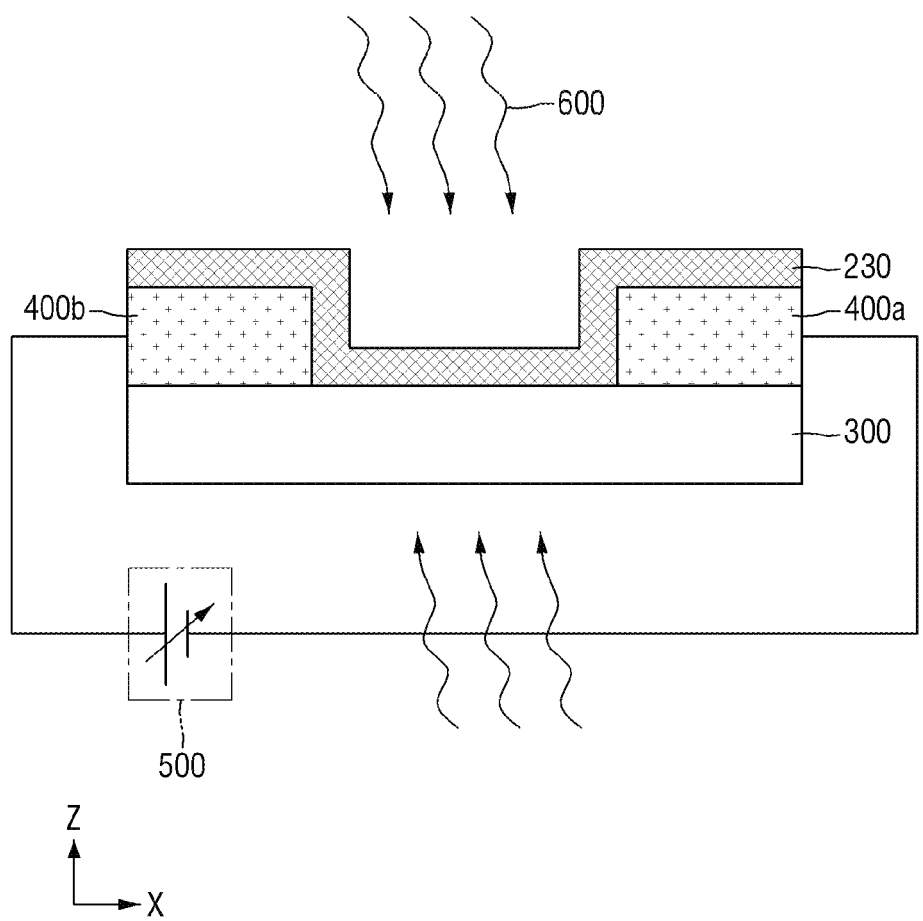
FIG. 35 illustrates the structure of a photoelectric device according to embodiments.

FIG. 35 illustrates the structure of a photoelectric device according to embodiments.

Referring to FIG. 35, the photoelectric device according to the embodiments may include a transparent substrate 300, a first electrode 400a, a second electrode 400b, and a fourth tin sulfide film 230.

The transparent substrate 300 may correspond to the second substrate 300 of FIGS. 1 through 5. That is, the transparent substrate 300 may be a transparent and flat glass substrate.

The first electrode 400a and the second electrode 400b may be formed on an upper surface of the transparent substrate 300. The first electrode 400a and the second electrode 400b may be spaced apart from each other. The first electrode 400a and the second electrode 400b may be electrically connected to each other by a power supply unit 500. The first electrode 400a may be connected to a cathode of the power supply unit 500, and the second electrode 400b may be connected to an anode of the power supply unit 500.

The first electrode 400a and the second electrode 400b may include ITO. Alternatively, in a photoelectric device according to embodiments, the first electrode 400a may include a transparent conductor such as FTO or silver nanowires.

A portion of the upper surface of the transparent substrate 300 may be exposed by a gap between the first electrode 400a and the second electrode 400b.

The fourth tin sulfide film 230 may be formed along the exposed upper surface of the transparent substrate 300 and upper and side surfaces of the first electrode 400a and the second electrode 400b. The fourth tin sulfide film 230 may be a tin sulfide film transferred according to the method of transferring a tin sulfide film described above. Therefore, the fourth tin sulfide film 230 may be a 2D material having a growth direction in the first direction X.

The fourth tin sulfide film 230 may transmit light. Therefore, incident light 600 may be incident on the upper surface of the transparent substrate 300 through the fourth tin sulfide film 230 and, conversely, may be incident on a lower surface of the transparent substrate 300. That is, the photoelectric device according to the embodiments may be a bifacial photoelectric device.

The power supply unit 500 may apply a voltage to the first electrode 400a and the second electrode 400b as described above. The power supply unit 500 may be a variable power source and may have the cathode connected to the first electrode 400a and the anode connected to the second electrode 400b. Accordingly, carriers, i.e., holes and electrons, generated by incident light may move to the power supply unit 500 through the first electrode 400a and the second electrode 400b. Specifically, the holes may move to the cathode, and the electrons may move to the anode.

The photoelectric device according to the embodiments may function as a photodetector that detects incident light.

Example 1

A SnS film grown vertically on a silicon substrate having an area of 15×15 mm$^2$ was transferred onto a pattern substrate in which ITO was patterned on a glass substrate.

Figure 36:
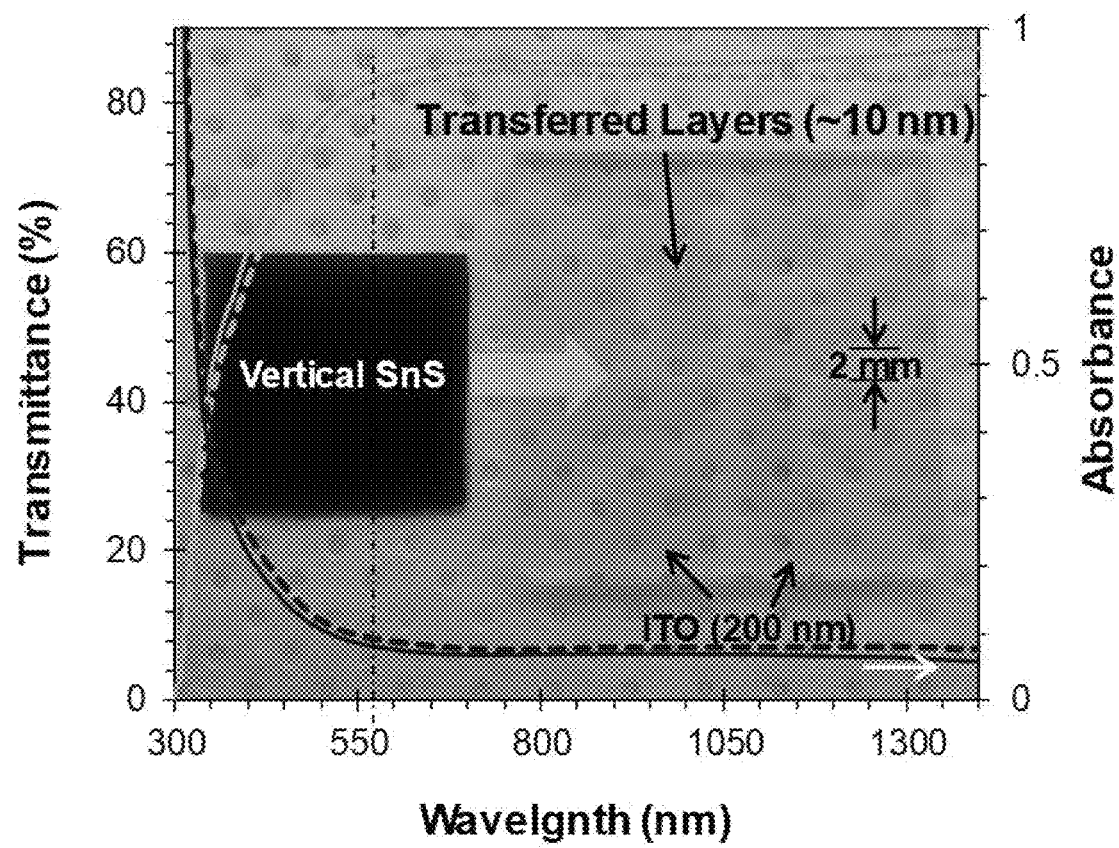
FIG. 36 illustrates the transmittance and absorbance of a photoelectric device according to Example 1.
Figure 37:
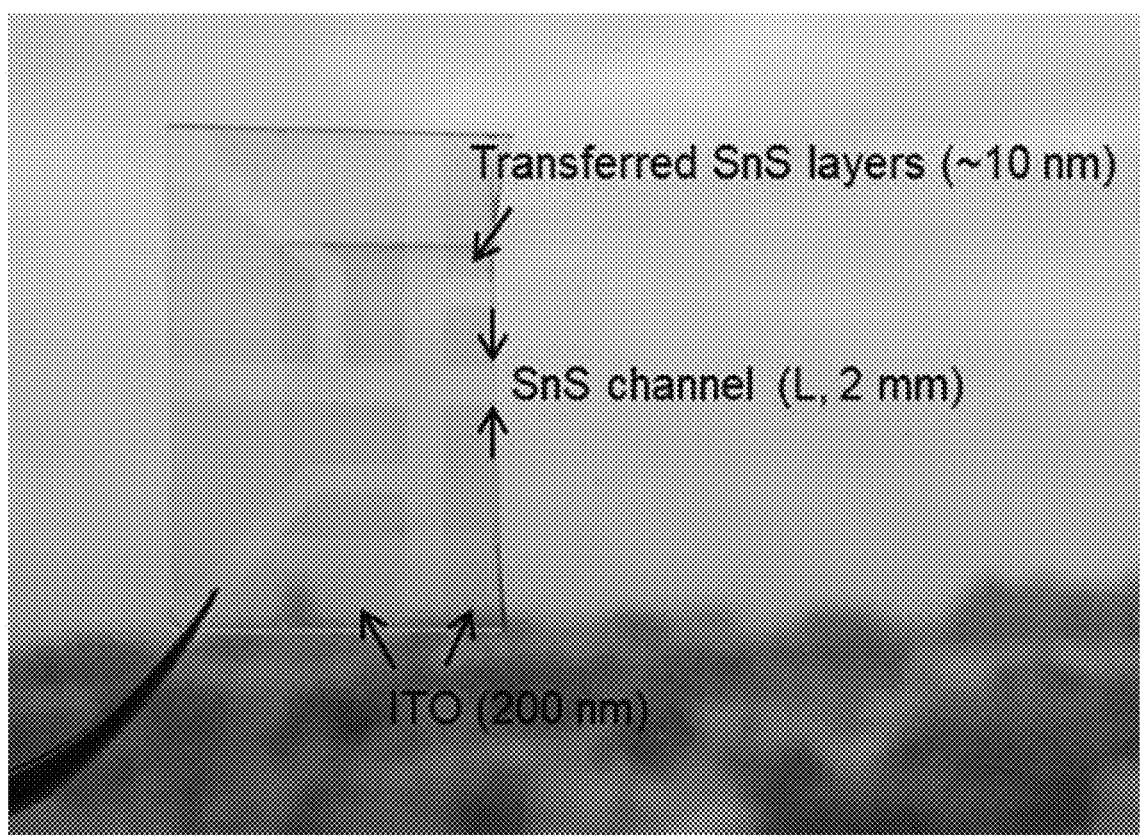
FIG. 37 is a planar image of a transparent photoelectric device according to embodiments.

FIG. 36 illustrates the transmittance and absorbance of a photoelectric device according to Example 1. FIG. 37 is a planar image of a transparent photoelectric device according to embodiments.

Referring to FIGS. 36 and 37, the photoelectric device of Example 1 has ITO electrode patterns with a thickness of 200 nm and includes a 10 nm-thick transferred SnS film in an area. The 10 nm-thick tin sulfide film has a transmittance of more than 80% (at 555 nm).

The ITO electrode patterns are spaced apart by a gap of 2 nm, which is covered with the transferred SnS film. The photoelectric device of Example 1 may function as a bifacial photodetector that receives incident light on both sides.

Comparative Example 1

The same procedure as in Example 1 was performed except that ITO was not formed and the SnS film was directly transferred onto the glass substrate.

Figure 38:
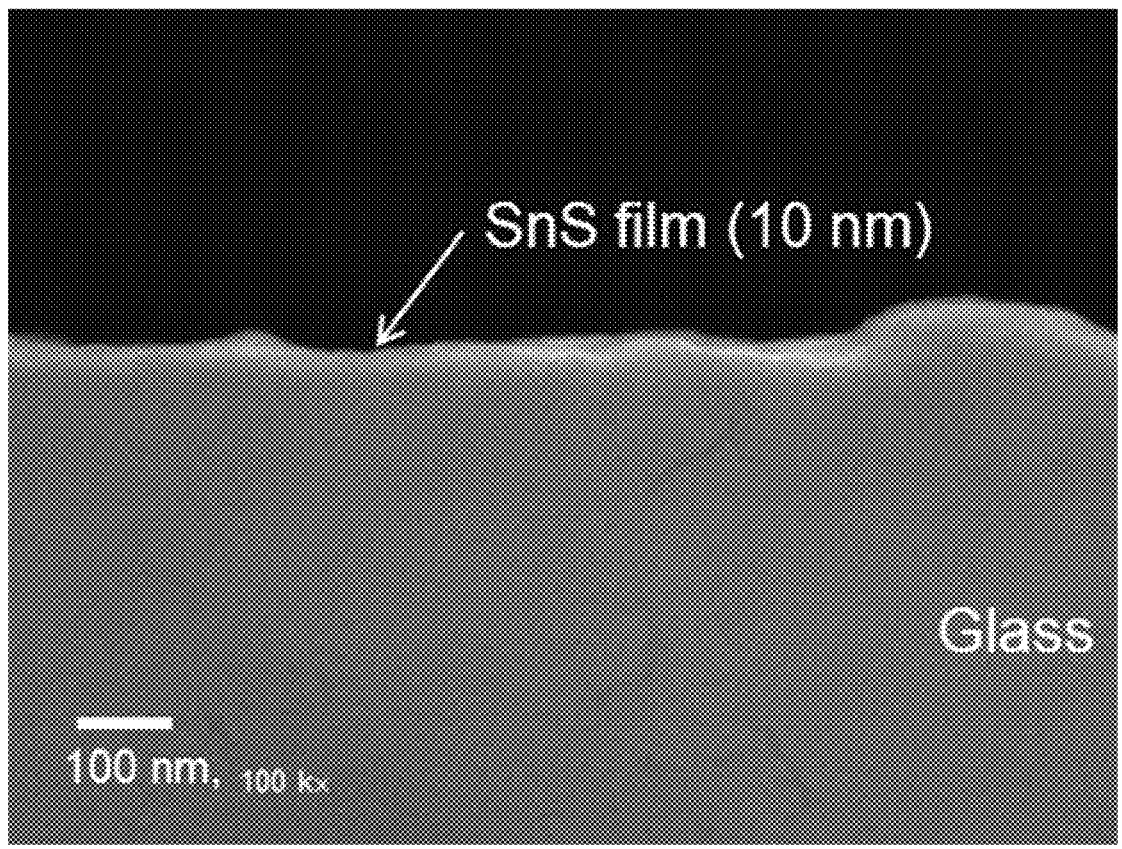
FIG. 38 is an FESEM image of a cross section of a photoelectric device according to Comparative Example 1.
Figure 39:
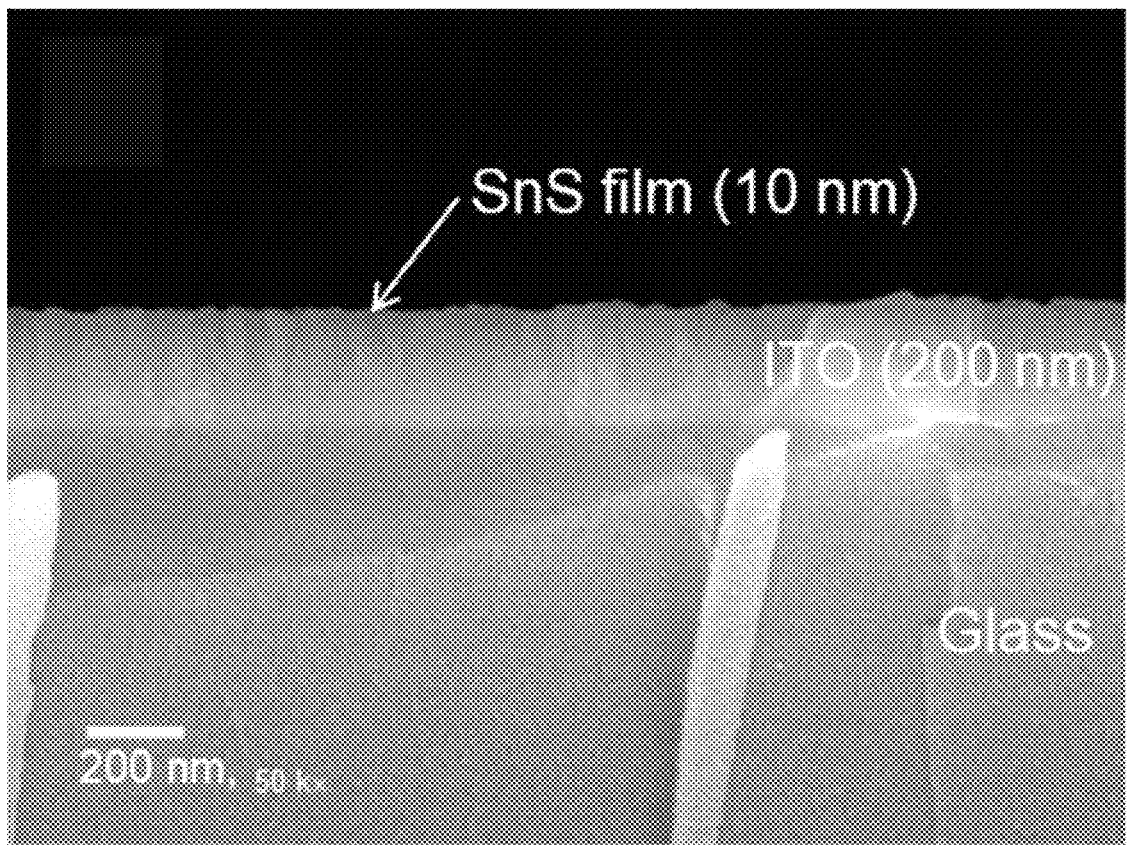
FIG. 39 is an FESEM image of a cross section of the photoelectric device according to Example 1.

FIG. 38 is an FESEM image of a cross section of a photoelectric device according to Comparative Example 1. FIG. 39 is an FESEM image of a cross section of the photoelectric device according to Example 1.

In FIGS. 38 and 39, the cross sections of glass, ITO and a SnS film are shown.

Experimental Example 1

In order to identify photoelectric characteristics of the photoelectric device of Example 1, current-voltage characteristics according to incident light, i.e., ultraviolet light (wavelength of 365 nm), visible light (wavelength of 530 nm) and near-infrared light (wavelength of 850 nm) were tested. Each test was conducted with increasing intensity of light.

Figure 40:
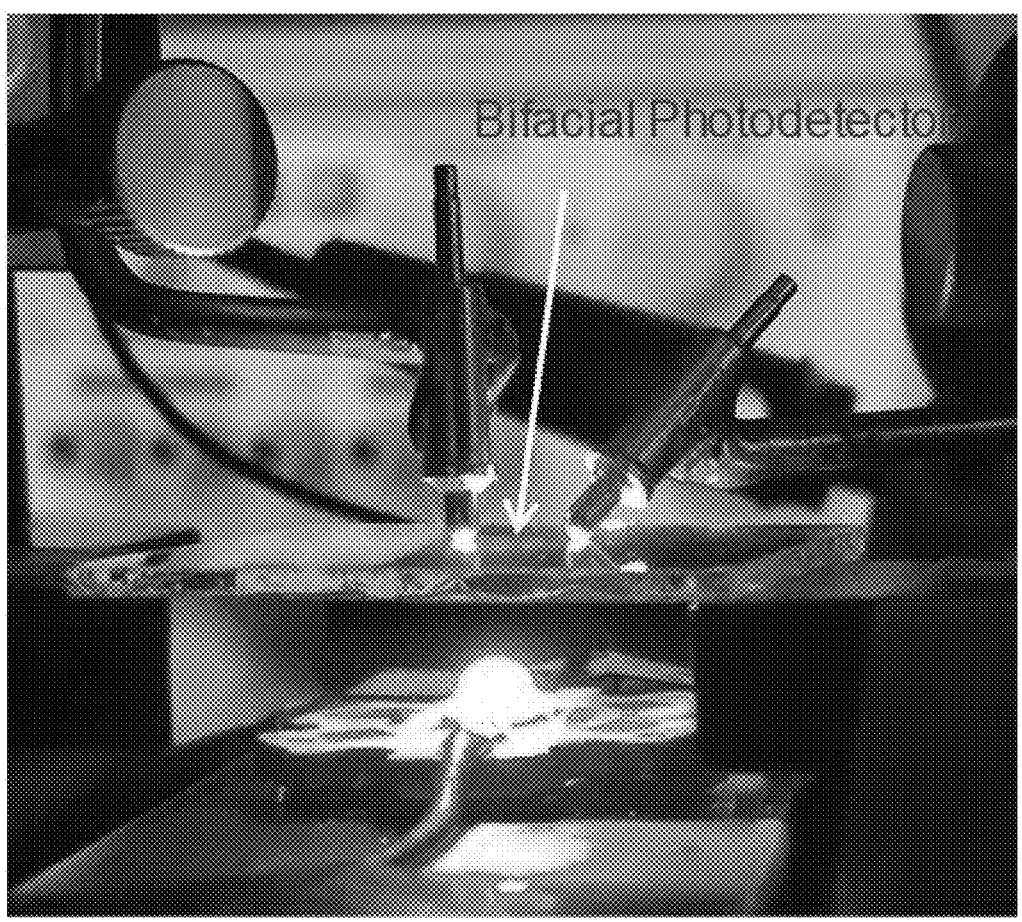
FIG. 40 is an image showing an experiment on a photoelectric device according to embodiments.

FIG. 40 is an image showing an experiment on a photoelectric device according to embodiments. In FIG. 40, a situation where the photoelectric element of Example 1 is tested for bifacial photodetecting is shown.

Figure 41:
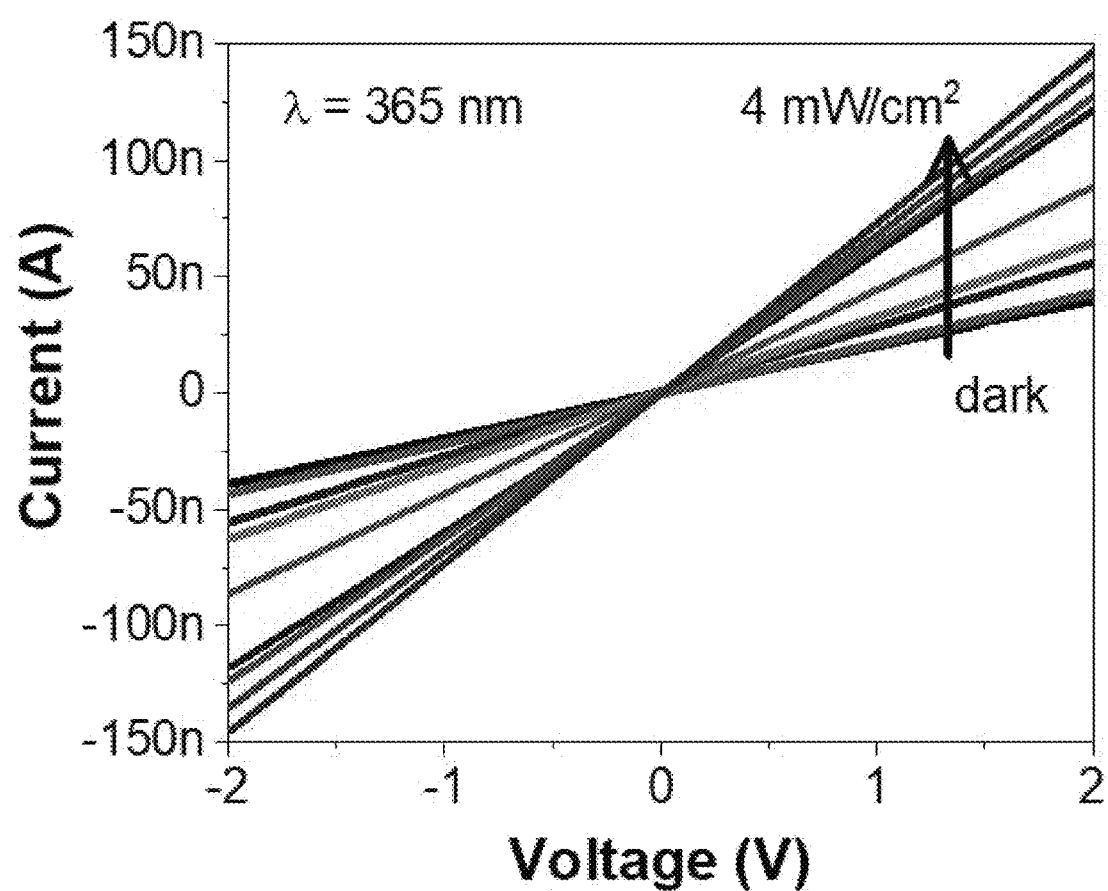
FIG. 41 is a graph illustrating current-voltage characteristics measured while changing a photoelectric device according to embodiments from a dark condition to an ultraviolet condition of 365 nm.
Figure 42:
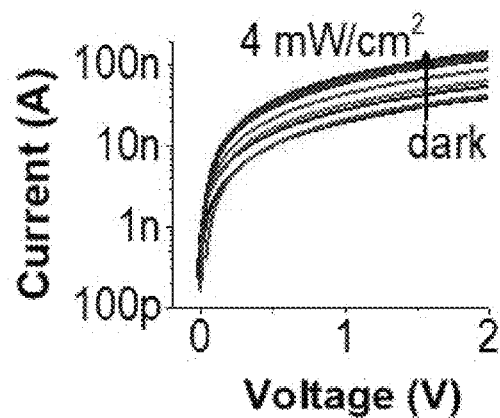
FIG. 42 is a graph obtained by semi-logarithmically scaling FIG. 41.
Figure 43:
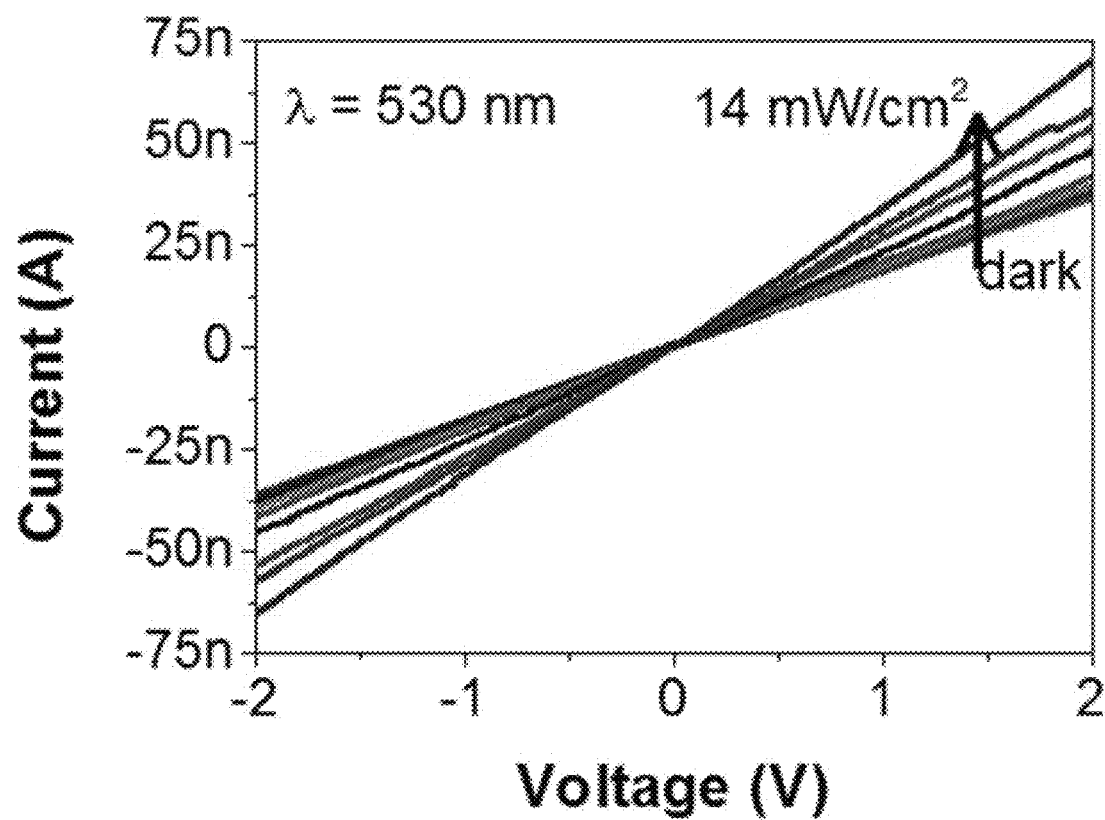
FIG. 43 is a graph illustrating current-voltage characteristics measured while changing the photoelectric device according to the embodiments from the dark condition to a visible light condition of 530 nm.
Figure 44:
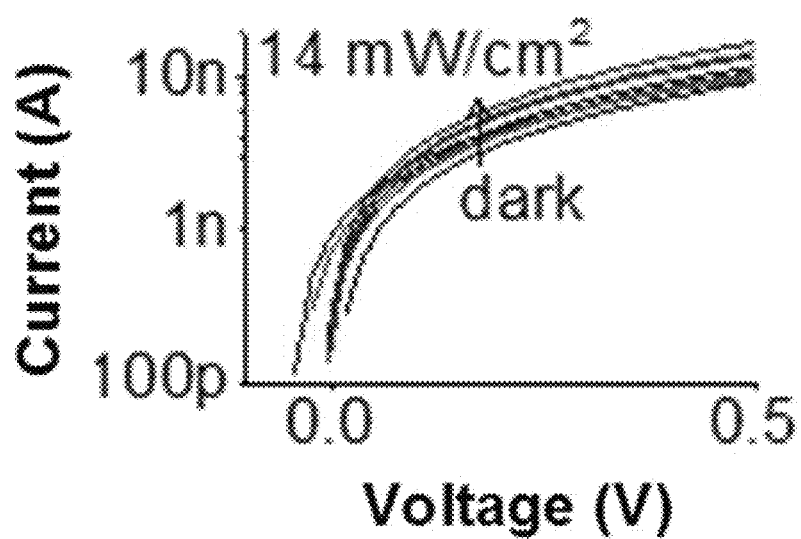
FIG. 44 is a graph obtained by semi-logarithmically scaling FIG. 43.
Figure 45:
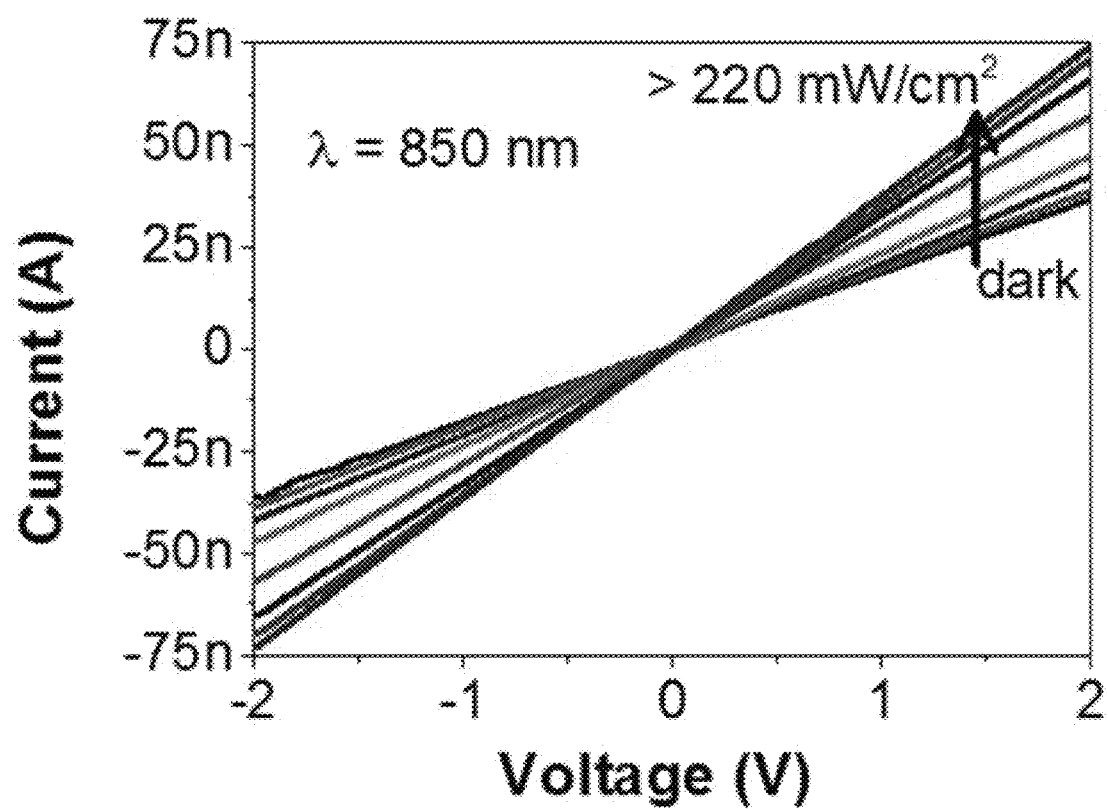
FIG. 45 is a graph illustrating current-voltage characteristics measured while changing the photoelectric device according to the embodiments from the dark condition to a near-infrared light condition of 850 nm.
Figure 46:
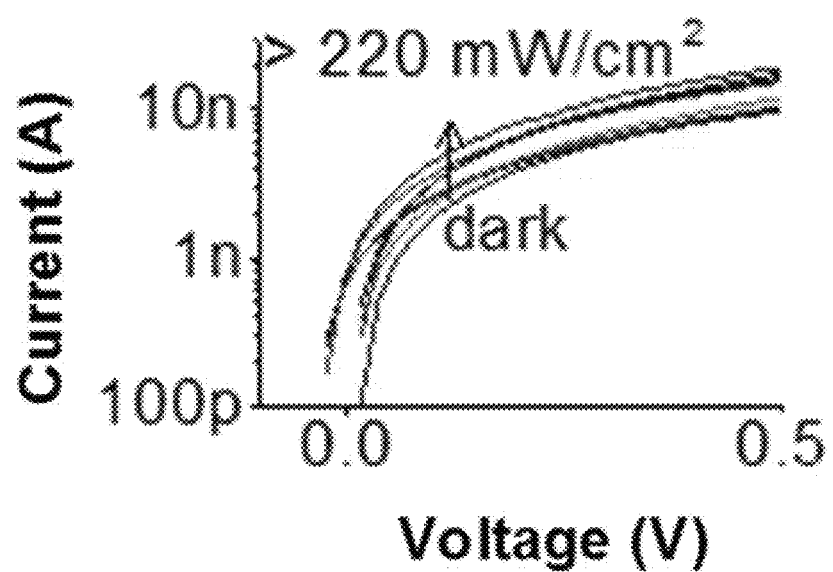
FIG. 46 is a graph obtained by semi-logarithmically scaling FIG. 45.

FIG. 41 is a graph illustrating current-voltage characteristics measured while changing a photoelectric device according to embodiments from a dark condition to an ultraviolet condition of 365 nm. FIG. 42 is a graph obtained by semi-logarithmically scaling FIG. 41. FIG. 43 is a graph illustrating current-voltage characteristics measured while changing the photoelectric device according to the embodiments from the dark condition to a visible light condition of 530 nm. FIG. 44 is a graph obtained by semi-logarithmically scaling FIG. 43. FIG. 45 is a graph illustrating current-voltage characteristics measured while changing the photoelectric device according to the embodiments from the dark condition to a near-infrared light condition of 850 nm. FIG. 46 is a graph obtained by semi-logarithmically scaling FIG. 45.

In FIGS. 41 through 46, the current-voltage characteristics of the photoelectric device of Example 1 in ultraviolet, visible, and near-infrared regions are shown. A channel resistance value of 50.6 MΩ in the dark condition is reduced to 13.7, 30.1 and 27.1 MΩ at 365 nm (4 mWcm$^{-2}$), 530 nm (14 mWcm$^{-2}$) and 850 nm (>220 mWcm$^{-2}$), respectively. The reduced channel resistance is due to the injection of free charge carriers under light irradiation caused by strong light-matter interactions. This makes broadband photodetection possible.

Figure 47:
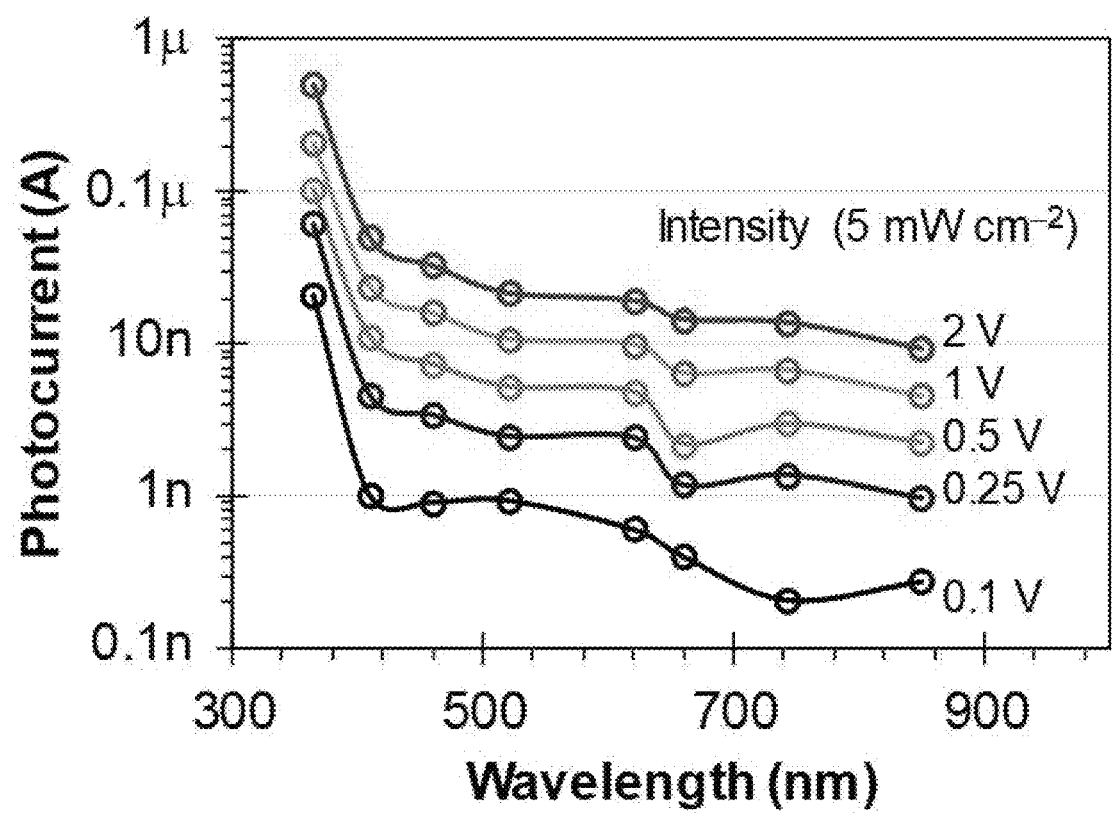
FIG. 47 is a graph illustrating photocurrent of a photoelectric device according to embodiments with respect to the wavelength of incident light of the same intensity.

FIG. 47 is a graph illustrating photocurrent of a photoelectric device according to embodiments with respect to the wavelength of incident light of the same intensity.

The results illustrated in FIG. 47 are similar to the absorbance tendency of FIGS. 31 and 36. These results show photocurrent spectra extending to near-infrared at a bias voltage ranging from 0.1 to 2 V. In addition, these results show an improvement in the ultraviolet region. Therefore, the photoelectric device of Example 1 can detect light of a wide range of wavelengths ranging from ultraviolet to near-infrared. Photoreaction is linearly proportional to the applied bias in the measured range.

Figure 48:
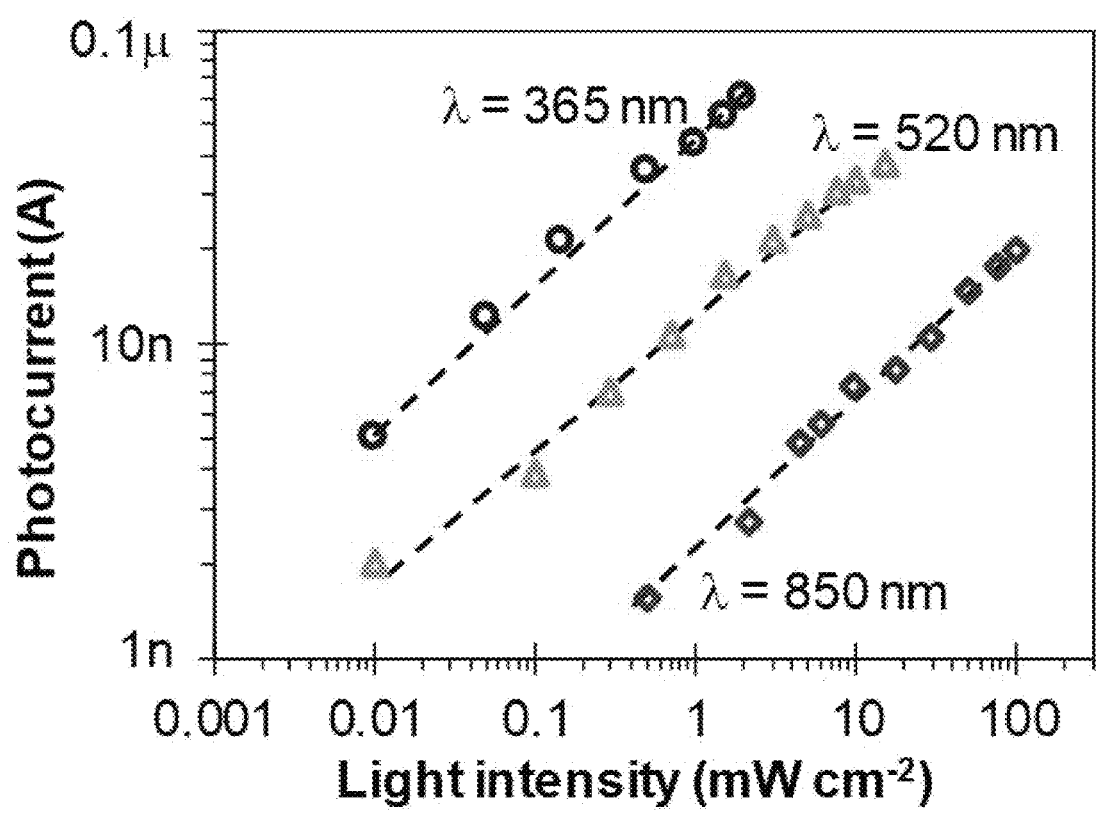
FIG. 48 is a graph illustrating photocurrents of a photoelectric device according to embodiments with respect to the intensities of ultraviolet, visible and near-infrared incident light.

FIG. 48 is a graph illustrating photocurrents of a photoelectric device according to embodiments with respect to the intensities of ultraviolet, visible and near-infrared incident light.

Referring to FIG. 48, a photocurrent dependent on the intensity of incident light was measured at a bias voltage of 2 V for ultraviolet, visible and near-infrared incident light. The photocurrent represents a linear response according to the intensity of incident light.

The photocurrent is useful for estimating a linear dynamic range of major parameters using a relation of LDR(λ)=20 log 10(P(λ)$_{max}$/P(λ)$_{min}$), where P(λ)$_{min}$ and P(λ)$_{min}$ represent maximum and minimum values of incident light intensity in a linear trend of photocurrent.

The values calculated by the above formula were LDR values of 46 dB, 64 dB and 53 dB corresponding to the wavelengths of 365 nm, 520 nm and 850 nm, respectively. The values can be a basis for a high-resolution imaging sensor having a see-through function and a simple structure.

The photodetection performance of a SnS film may be evaluated by reactivity (R*) and detectability (D*). This may be defined by $R^*(\lambda)=I_{photo}(\lambda)/P_{in}(\lambda)$ and $D^*(\lambda)=R^*(\lambda)/\sqrt{(2qI_d/A)}$, where $I_{photo}$ is photocurrent-dark current, $P_{in}$ is optical power, q is electron charge, $I_d$ is a bias-specific dark current, and A is the area of a device.

A transferred SnS film showed, as R* and D* values, 0.66 mA/W and 3.73×10$^9$ Jones, 54.8 μA/W and 3.08×10$^8$ Jones, and 3.92 μA/W and 2.2×10$^7$ Jones for ultraviolet light, visible light and near-infrared light, respectively.

Figure 49:
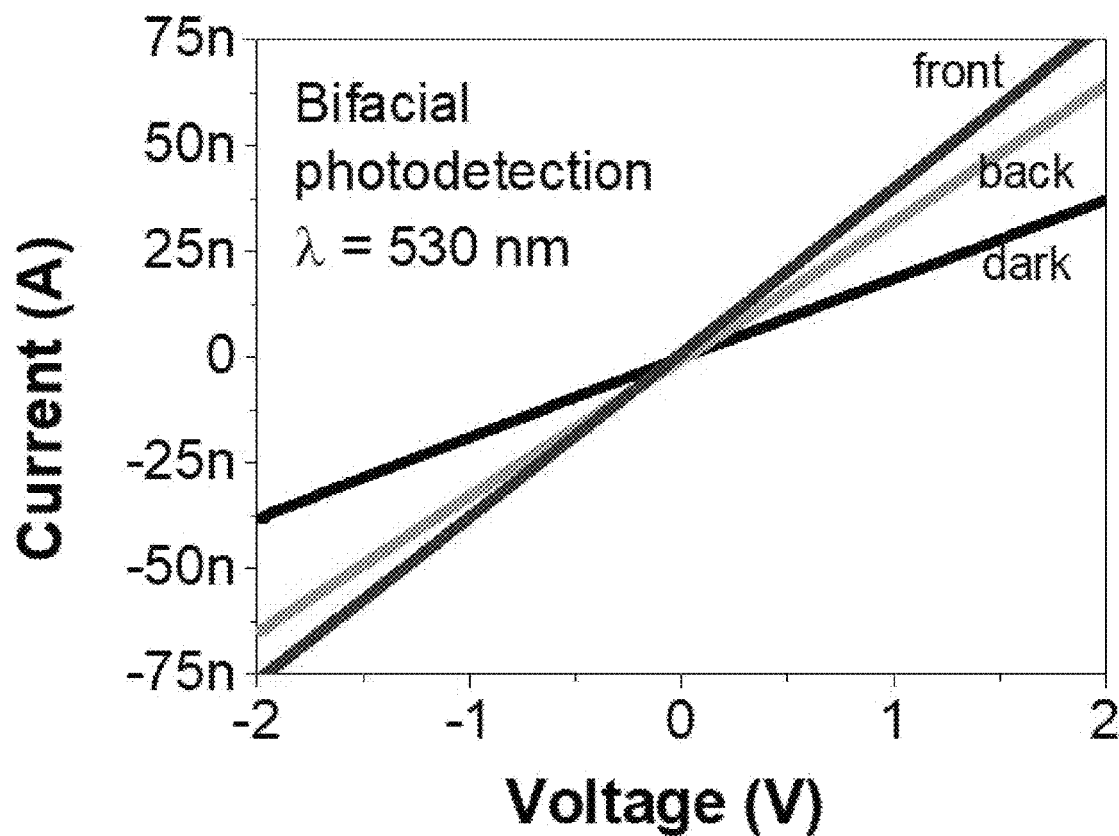
FIG. 49 is a current-voltage graph for explaining bifacial characteristics of a photoelectric device according to embodiments.

FIG. 49 is a current-voltage graph for explaining bifacial characteristics of a photoelectric device according to embodiments.

Referring to FIG. 49, the current-voltage characteristics of the photoelectric device of Example 1 are characterized by bifacial photodetection for light of 530 nm incident through the front and back.

The R* value for the front incident light is 68.8 μA/W, which is 160% higher than that for the back incident light. Therefore, excellent optical response is provided in both directions.

Experimental Example 2

The transient optical response of the photoelectric device of Example 1 was measured to evaluate the speed of photodetection capability and the dependence on the wavelength of light and the bias voltage.

Figure 50:
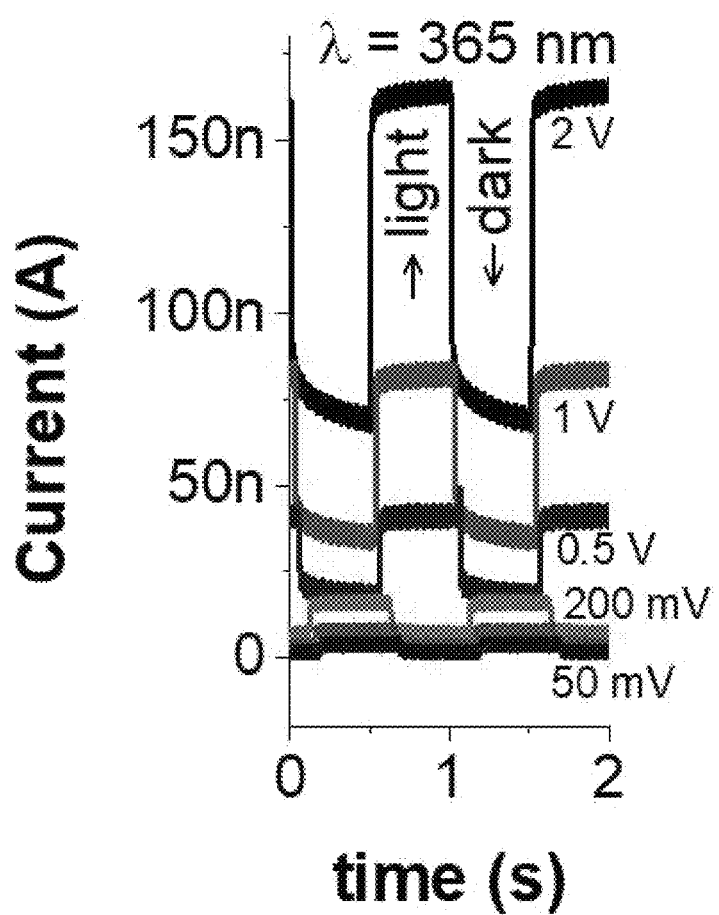
FIG. 50 is a graph illustrating the photoreaction to light of 365 nm of a photoelectric device according to embodiments.
Figure 51:
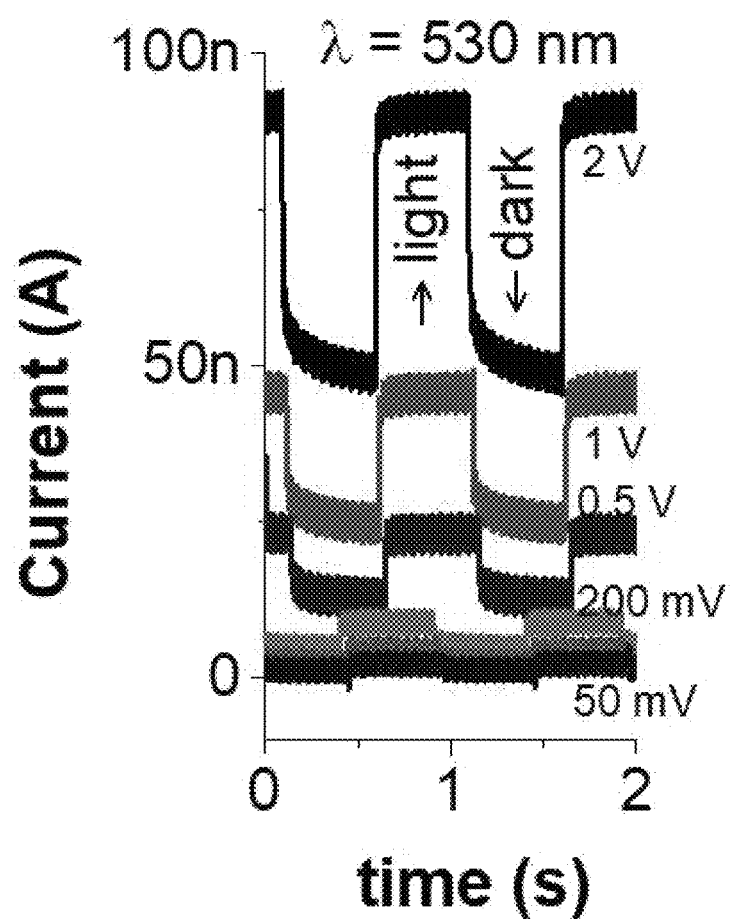
FIG. 51 is a graph illustrating the photoreaction to light of 530 nm of the photoelectric device according to the embodiments.
Figures 52, 53:
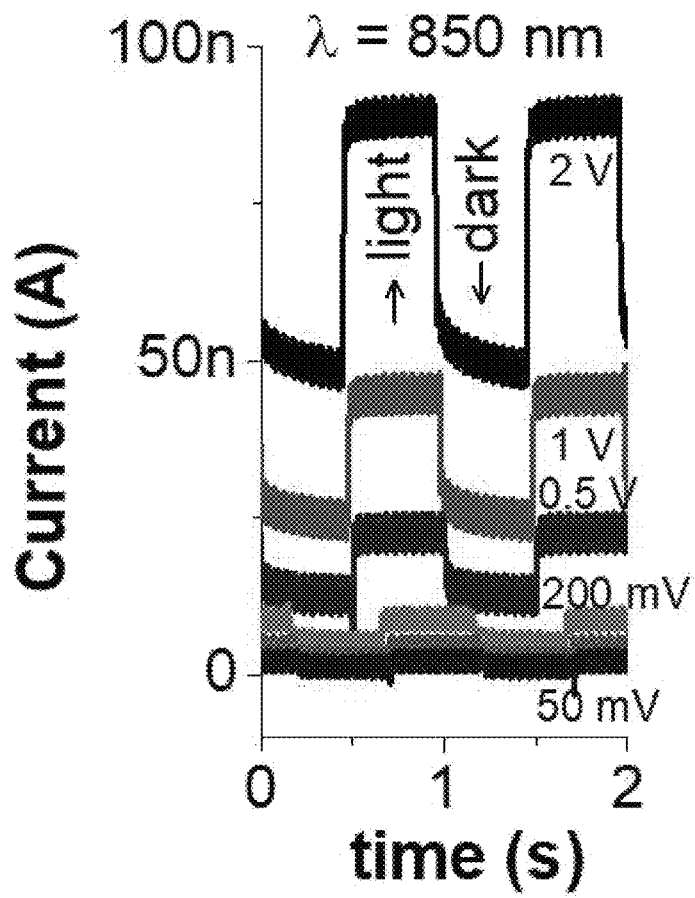
FIG. 52 is a graph illustrating the photoreaction to light of 850 nm of the photoelectric device according to the embodiments.
FIG. 53 is a table summarizing photoreaction characteristics of a photoelectric device according to embodiments.

FIG. 50 is a graph illustrating the photoreaction to light of 365 nm of a photoelectric device according to embodiments. FIG. 51 is a graph illustrating the photoreaction to light of 530 nm of the photoelectric device according to the embodiments. FIG. 52 is a graph illustrating the photoreaction to light of 850 nm of the photoelectric device according to the embodiments.

Referring to FIGS. 50 through 52, the SnS film of the photoelectric device of Example 1 exhibits a fast photodetection speed, as apparent from a short response time of 2.9 ms. A rise time is generally measured as the time taken to increase from 10% to 90% of a saturated photocurrent under incident light conditions. A fall time is defined as the time taken to decrease from 10% to 90% of the saturated photocurrent.

FIG. 53 is a table summarizing photoreaction characteristics of a photoelectric device according to embodiments.

Referring to FIG. 53, the SnS film of the photoelectric device of Example 1 having a channel width of 2 mm has a rise time of 2.9 to 9.1 ms and a fall time of 3 to 58 ms for a broad band of wavelengths. Here, the fall time is longer (20 to 58 ms) at 365 nm than at other wavelengths (visible and near-infrared). This is due to an exothermic effect. On the other hand, at 530 nm, since the bandgap and photo energy of the SnS film are well matched, the fall time may be much shorter (3 to 9 ms). In the case of near-infrared (850 nm), the fall time is about 20 to 25 ms. This is due to shift current characteristics induced by near-infrared incident light.

Experimental Example 3

The stability of the SnS film of the photoelectric device of Example 1 was examined under an ultraviolet light pulse (0.75 Hz, square wave) in an atmosphere at room temperature.

Figure 54:
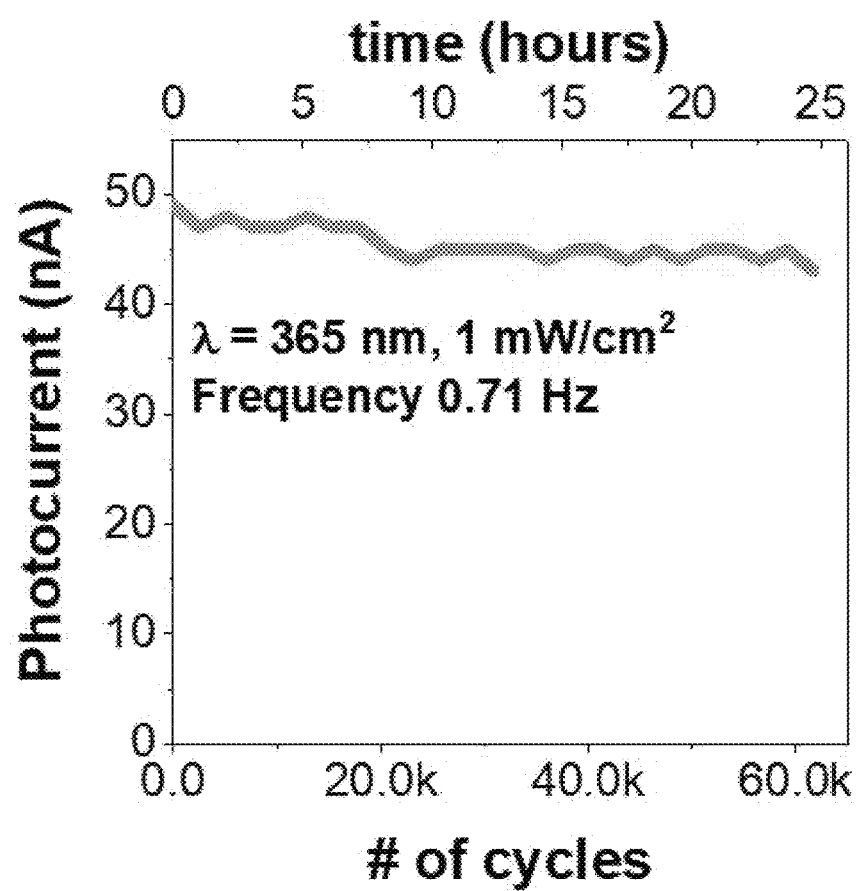
FIG. 54 is a graph illustrating stability of a photoelectric device according to embodiments in a pulse ultraviolet light condition.

FIG. 54 is a graph illustrating stability of a photoelectric device according to embodiments in a pulse ultraviolet light condition.

Referring to FIG. 54, the excellence of Example 1 under continuous ultraviolet light incidence in a given condition can be confirmed.

An embodiment the present disclosure provides at least one of the following advantages.

That is, in a method of transferring a tin sulfide film according to embodiments, a tin sulfide film can be positioned by bonding two substrates, i.e., a main substrate on which the tin sulfide film is grown and a target substrate to which the tin sulfide film is to be transferred and then performing an RTP.

In addition, a transparent 2D film can be formed by placing only a few 2D tin sulfide films.

A photoelectric device according to embodiments may have improved operating performance because it includes a transparent 2D film transferred without heating and contamination due to the non-use of mechanical exfoliation and chemical exfoliation.

However, the effects of the embodiments are not restricted to the one set forth herein. The above and other effects of the embodiments will become more apparent to one of daily skill in the art to which the embodiments pertain by referencing the claims.

While the exemplary embodiments of the present disclosure have been described with reference to experimental examples and the accompanying drawings, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:

1. A method of transferring a tin sulfide film, the method comprising:
    forming a first tin sulfide film on a first substrate;
    placing a second substrate on the first tin sulfide film; and
    forming a second tin sulfide film bonded to a surface of the second substrate by transferring a portion of the first tin sulfide film to the second substrate through a rapid thermal process (RTP), wherein the thickness of the second tin sulfide film varies according to the duration of the RTP.

2. The method of claim 1, wherein the second tin sulfide film is disposed on the first tin sulfide film, and an interface between the first and second tin sulfide films is parallel to the surface of the second substrate.

3. The method of claim 1, wherein the first tin sulfide film comprises SnS.

4. The method of claim 3, wherein the second tin sulfide film extends in a second direction intersecting the first direction.

5. The method of claim 4, wherein the first direction is perpendicular to the second direction.

6. The method of claim 1, wherein the second tin sulfide film comprises SnS.

7. The method of claim 1, wherein the first tin sulfide film extends in a first direction, and the first direction is a direction of an upper surface of the first substrate.

8. The method of claim 1, wherein the second tin sulfide film comprises:
- a first single film which is parallel to the second substrate; and
- a second single film which is formed on the first single film and parallel to the second substrate.

9. The method of claim 1, wherein the first tin sulfide film comprises SnS, and the forming of the first tin sulfide film on the first substrate comprises sputtering a tin sulfide target and forming the first tin sulfide film through sulfur depletion.

10. The method of claim 1, wherein the second tin sulfide film comprises a plurality of stacked single films, and the number of the single films varies according to the duration of the RTP.

11. The method of claim 1, further comprising:
separating the second substrate and the second tin sulfide film from the first tin sulfide film;
placing a third substrate on the first tin sulfide film; and
forming a third tin sulfide film bonded to a surface of the third substrate by transferring a portion of the first tin sulfide film to the third substrate through an RTP.

12. The method of claim 1, further comprising:
separating the second substrate and the second tin sulfide film from the first tin sulfide film;
placing a third substrate on the second tin sulfide film; and
forming a third tin sulfide film bonded to a surface of the third substrate by transferring a portion of the second tin sulfide film to the third substrate through an RTP.

13. The method of claim 1, wherein the temperature of the RTP is 100° C. to 1000° C.

14. The method of claim 1, wherein the duration of the RTP is 1 second to 3 hours.

* * * * *